United States Patent
Bischel et al.

(10) Patent No.: US 7,653,109 B2
(45) Date of Patent: Jan. 26, 2010

(54) MULTI-CHANNEL LASER PUMP SOURCE FOR OPTICAL AMPLIFIERS

(75) Inventors: William K. Bischel, Menlo Park, CA (US); David K. Wagner, San Jose, CA (US); Harald Guenther, Los Gatos, CA (US); Simon J. Field, Palo Alto, CA (US); Markus P. Hehlen, Los Gatos, CA (US); Richard B. Tompane, Los Altos, CA (US); Andrew T. Ryan, Sunnyvale, CA (US); C. Geoffrey Fanning, Hillsboro, OR (US); Jim W. Li, Fremont, CA (US); Nina D. Morozova, San Jose, CA (US)

(73) Assignee: Gemfire Corporation, Fremont, CA (US)

( * ) Notice: Subject to any disclaimer, the term of this patent is extended or adjusted under 35 U.S.C. 154(b) by 407 days.

(21) Appl. No.: 11/768,150

(22) Filed: Jun. 25, 2007

(65) Prior Publication Data

US 2007/0248139 A1 Oct. 25, 2007

Related U.S. Application Data

(60) Division of application No. 10/898,537, filed on Jul. 23, 2004, now Pat. No. 7,235,150, which is a continuation of application No. 10/616,008, filed on Jul. 9, 2003, now abandoned, which is a continuation of application No. 09/784,687, filed on Feb. 14, 2001, now abandoned.

(51) Int. Cl.
  *H01S 5/00* (2006.01)
(52) U.S. Cl. .................... 372/50.12; 156/212
(58) Field of Classification Search .................. 385/88; 356/401; 372/50, 50.12; 156/300

See application file for complete search history.

(56) References Cited

U.S. PATENT DOCUMENTS 4,079,404 A 3/1978 Comerford et al.

(Continued)

FOREIGN PATENT DOCUMENTS

| JP | 05-323139 A | 12/1993 |
|---|---|---|
| WO | 98/19194 | 5/1998 |
| WO | 00/28362 A1 | 5/2000 |

OTHER PUBLICATIONS

Hsu H P et al: "ARPA Analog Optoelectronic Module Program: Packaging Challenges Foranalog Optoelectronic Arrays" Proceedings of the Electronic Components and Technology Conference. Las Vegas, May 21-24, 1995.*

Hsu H P et al: "ARPA Analog 1 Optoelectronic Module Program: Packaging Challenges Foranalog Optoelectronic I Arrays" I Proceedings of the Electronic Components and Technology Conference. Las Vegas, May.

*Primary Examiner*—Minsun Harvey
*Assistant Examiner*—Tuan N. Nguyen
(74) *Attorney, Agent, or Firm*—Warren S. Wolfeld; Haynes Beffel & Wolfeld LLP

(57) ABSTRACT

An optical assembly, such as a multiple output diode laser pump source for EDFAs, is formed by pressing an optical array emitter chip against a standoff structure protruding from a submount such that the emitter chip deforms to match the curvature of the standoff structure. An IO chip is also juxtaposed against the standoff structure such that its optical receivers can receive optical energy from the emitter chip. The IO chip can provide various optical functions, and then provide an optical array output for coupling into an optical fiber array. The standoff structure preferably contacts the emitter chip over an aggregate contact area much smaller than the area by which the emitter chip overlaps the submount. The materials used for bonding the emitter chip and the IO chip to the submount are disposed in the recesses between standoffs and not on the contact surfaces of the standoff structure.

49 Claims, 13 Drawing Sheets

U.S. PATENT DOCUMENTS

| | | | |
|---|---|---|---|
| 4,639,074 A * | 1/1987 | Murphy | 385/49 |
| 4,836,638 A * | 6/1989 | Finzel | 385/59 |
| 5,010,587 A | 4/1991 | Eklund et al. | |
| 5,179,609 A | 1/1993 | Blonder et al. | |
| 5,481,629 A * | 1/1996 | Tabuchi | 385/14 |
| 5,621,837 A | 4/1997 | Yamada et al. | |
| 5,985,064 A | 11/1999 | Sato et al. | |
| 5,985,685 A | 11/1999 | Lealman et al. | |
| 5,999,269 A * | 12/1999 | Haugsjaa et al. | 356/401 |
| 6,023,339 A | 2/2000 | Haugsjaa et al. | |
| 6,081,638 A | 6/2000 | Zhou | |
| 6,101,210 A | 8/2000 | Bestwick et al. | |
| 6,129,804 A | 10/2000 | Gaynes et al. | |
| 6,169,757 B1 | 1/2001 | Merritt | |
| 6,235,141 B1 | 5/2001 | Feldman et al. | |
| 6,236,773 B1 | 5/2001 | Butler et al. | |
| 6,243,350 B1 | 6/2001 | Knight et al. | |
| 6,298,027 B1 | 10/2001 | Wilde et al. | |
| 6,316,281 B1 | 11/2001 | Lee et al. | |
| 6,445,841 B1 | 9/2002 | Gloeckner et al. | |
| 6,456,766 B1 | 9/2002 | Shaw et al. | |
| 6,483,969 B1 | 11/2002 | Yap et al. | |

* cited by examiner

MULTI-CHANNEL LASER PUMP SOURCE FOR OPTICAL AMPLIFIERS

PRIORITY INFORMATION

This application is a divisional of U.S. application Ser. No. 10/898,537 filed 23 Jul. 2004 (which is set to issue on 26 Jun. 2007 as U.S. Pat. No. 7,235,150), titled "Multi-Channel Laser Pump Source for Optical Amplifiers," which application is a continuation of U.S. application Ser. No. 10/616,008 filed 09 Jul. 2003, titled "Multi-Channel Laser Pump Source for Optical Amplifiers" (now abandoned), which application is a continuation of U.S. application Ser. No. 09/784,687 filed 14 Feb. 2001, titled "Multi-Channel Laser Pump Source for Optical Amplifiers" (now abandoned), all of which are incorporated herein by reference.

BACKGROUND OF THE INVENTION

1. Field of the Invention

This invention relates generally to semiconductor diode laser based pump sources, and more specifically to techniques for construction of planar multi-channel diode laser pump sources.

2. Description of Related Art

Optical amplifiers are an accepted part of long-haul telecommunications systems. They are used to amplify signals after optical fiber propagation losses over long transmission distances typical of such as the nation-wide networks. A typical system uses a plurality of Erbium doped fiber amplifiers (EDFAs) pumped by semiconductor diode lasers. Semiconductor diode laser pump sources for EDFAs typically operate at wavelengths of 980 nanometers (nm) or 1480 nm. The EDFA is capable of amplifying wavelengths over a wide bandwidth with a gain spectrum that peaks at about 1530 nm and that typically extends to 1570 nm, or 1620 nm in advanced configurations. Usable output or optical gain is achievable over this 40 to 90 nm region. This wide bandwidth provides the opportunity for the optical signal to be carried on a large number of wavelength channels that can be independently and all-optically amplified by an EDFA. This technique of wavelength division multiplexing (WDM) is currently driving the expansion of modern telecommunications.

The EDFA has been available for about 10 years, during which time the performance of the device has increased markedly, benefitting in particular from improved performance of semiconductor diode laser pump sources. However, this improved performance is typically accompanied by increased cost. The increased cost is readily tolerated in the high value, relatively low fiber count long haul system because each fiber is able to carry many data channels via WDM, each data channel being amplified simultaneously within a single EDFA. Thus the cost of the high performance EDFA is shared amongst many revenue generating data streams and subscribers.

To achieve continued expansion of data carrying bandwidth to the office and home, the fiber optic transmission system must be extended from the point-to-point long-haul network to Metropolitan (Metro) and access networks. The more diffuse nature of the Metro network, and the need to service users on a more individual basis means that less data is carried onto a single fiber, generally causing proposed Metro networks to be characterized as having fewer data channels per fiber at lower transmission rates and more individual fiber transmission paths and shorter span lengths than long haul systems. The lower data channel count per fiber means less revenue per fiber, and the increased number of separate fibers and decreased span length means increased component numbers. The combination of these two factors leads to a requirement of lower cost components to enable profitable Metro network implementation.

EDFAs play a key role in Metro networks, just as they do in the long-haul backbone. The use of EDFAs enable longer ring or mesh propagation distances within the network, and also enable the use of lossy all-optical components such as wavelength demultiplexers and multiplexers, or optical cross connects without the need for costly detection, electrical regeneration, and reemission/modulation of the data signals. Thus a lower cost implementation of the current EDFA found in long-haul networks is required to drive the installation and commissioning of Metro networks.

A typical long-haul network EDFA is composed of a number of subsystems or components including one or more erbium doped fiber sections, optical isolators to eliminate back reflection, and one or more semiconductor laser diode pumps with their associated wavelength couplers to combine them with the 1550 nm data signal on the network fiber. A significant proportion of the overall cost of the amplifier results from the semiconductor diode laser pumps, which typically cost many thousands of dollars each. Thus, a lower cost implementation of the diode laser pump source would enable lower cost EDFAs for application in Metro networks.

Currently, two main types of diode laser pump sources exist: those that operate at 980 nm and those that operate at 1480 nm. These two wavelengths are absorbed quite efficiently by the erbium ions in the fiber core and offer different performance characteristics for the overall amplifier system. Pumping at 980 nm is usually chosen for pre-amplifiers where low noise amplification is important, as the 980 nm pumping may lead to a more complete population inversion of the emitting erbium state and to a correspondingly lower amplifier noise figure as compared to 1480 nm pumping. Diode lasers operating at 1480 nm are often chosen for high output power amplifiers as the optical-optical conversion efficiency is higher and the dollar cost per mW of output power from the diode laser is generally lower than for 980 nm diode lasers.

Prior art semiconductor diode laser pump sources operating at 980 nm (a very similar device configuration is used at 1480 nm, simply utilizing a different semiconductor material system to generate the different wavelengths) generally consist of a number of individual components, shown symbolically in FIG. 1. A diode laser chip 105 is soldered to a submount 110 to provide thermal heatsinking and electrical connection. Each diode laser chip 105 has a single active laser region that is capable of generating and emitting several hundred mW of output power in a single transverse optical mode. Submount 110 is positioned inside a butterfly package 115 that has the capability of achieving a hermetic seal on final closure. A single-mode optical fiber 120 is fed through a ferrule and opening in butterfly package 115 and then brought into alignment with the output aperture of diode laser chip 105. To achieve a high coupling efficiency between diode laser chip 105 and single-mode optical fiber 120, a lens or chisel shaped tip may be formed on the end face of fiber 120 so that the rapidly diverging optical mode of diode laser chip 105 is efficiently converted into the relatively much larger and slower diverging mode of fiber 120.

In addition to the need for the lensed or chisel ended fiber 120, there are also very tight constraints placed on the positioning of the tip of fiber 120 relative to the emitting aperture of diode laser chip 105. In fact, it is necessary to control the position of fiber 120 to sub-micron accuracy to achieve optimum coupling. This precise control is typically achieved by holding fiber 120 via a computer controlled multi-axis micropositioner. Diode laser chip 105 is energized to generate output light, and the output from fiber 120 is monitored using a photodiode or power meter. The micropositioners then move fiber 120 to optimize for maximum signal transmitted therethrough, after which fiber 120 is fixed in position, typically by laser welding of a metallized fiber ferrule 125 to a holder clip 130 mounted to the package or submount 110. Often it is necessary to tweak the alignment of fiber 120 after initial fixing with further laser-assisted or mechanical bending of holder clip 120.

The fully active fiber alignment process described above is both cumbersome and slow, and although it can result in remarkably good coupling efficiency between the diode laser and fiber (in excess of 60%), it does not lend itself well to high volume, high yield and low cost manufacturing. It is this fully active alignment step that accounts for a significant portion of the cost of constructing a diode laser pump source for an EDFA.

In the prior art, attempts have also been made to construct multi-channel integrated laser arrays and to align them with integrated optoelectronic chips or directly with fiber arrays. The use of a self-aligned solder assembly with mechanical stops and misaligned solder joints is reported to provide three-dimensional passive alignment between the laser diode axis of each diode and a corresponding optical axis of an optical fiber with lateral misalignment of ±2 microns and vertical misalignment of ±0.75 microns, with coupling losses of about 4 dB per channel reported for a 4 diode array.

Such prior art techniques do not provide the level of precision obtained using the active fiber alignment described above, and which is conventionally required to achieve efficient coupling between a diode laser and an optical fiber. Difficulties include height variation (that is spacing between the diode laser chip and the substrate) across the lateral array dimension due to solder thickness variations or bonding pressure variations. Thus, co-planarity of the bonding surfaces is difficult to achieve to the degree desired for very efficient coupling (typically about 0.2 microns over 10 mm for a high channel count laser diode array).

Bowing of the diode laser chip also gives rise to misalignments across an array of emitters. Fabrication of the diode laser structure using epitaxial growth and planar surface lithography often results in a laser array chip with a residual bow or warpage.

In addition, misalignment can also be caused by particles trapped between the diode array and the mounting surface. Keeping large planar surfaces free of particles is difficult. Even a single sub-micron particle is sufficient to cause severe misalignment along a large array. In one prior art approach, the presence of foreign particles is accommodated by supporting the laser array on a pair of standoffs, above the large substrate area, one standoff at each end of the array. This may help to minimize the effect of foreign particles, but does not address the absolute positioning of the multiple emitters across the array, and cannot alleviate misalignment arising from laser array curvature due to warped or bowed wafers.

In view of the problems associated with prior art techniques for manufacturing pump sources, it is an object of this invention to provide a semiconductor laser array pump source for optical amplifiers which may be manufactured relatively easily and inexpensively, and which enables precise optical alignment of components even in the presence of foreign particles and/or component warpage or bowing.

SUMMARY OF THE INVENTION

Roughly described, a multiple output diode laser pump source is manufactured by an array scaleable optical alignment process, which can achieve simultaneous highly efficient coupling between each of the emitters in a laser diode array and a respective receiving waveguide array. The waveguide array may be fabricated (without limitation) in a lithium niobate, glass substrate, or other integrated optics chip. The simultaneous coupling of all of the emitter/waveguide pairs advantageously reduces the number of manufacturing steps, thereby allowing the pump source to be manufactured more rapidly and inexpensively.

According to one aspect of the invention, the simultaneous array scalable alignment process utilizes a standoff structure on a submount to define a reference surface for mounting of a laser array and a receiving integrated optic waveguide chip. Mounting both chips to the single reference surface permits optical alignment in the most critical dimension, perpendicular to the plane of the arrays, to be performed passively, leaving active alignment required only in the transverse and longitudinal dimensions and the yaw axis.

In addition, the standoff structure also can overcome other problems in the prior art by, for example, eliminating the effect of solder deposition thickness on emitter position, lessening the impact of foreign particulate defects by decreasing the contact area between the arrays and the submount, and alleviating the effects of non-uniform bonding pressure and chip bow or warp by distributing the reference surface across the entire array and therefore referencing the positions relative to the submount of all emitters directly to the same reference surface.

The invention will be better understood upon reference to the following detailed description in connection with the accompanying drawings:

BRIEF DESCRIPTION OF DRAWINGS

FIG. 19b is a symbolic diagram showing a perspective view of the alternative embodiment of the invention depicted by FIG. 19a.

DETAILED DESCRIPTION

The invention will now be described in reference to various non-limiting embodiments thereof. It should be noted that individual elements or features of different embodiments described below may be combined in various permutations to produce a laser pump source having a set of desired physical and/or operational characteristics, and that such combinations are within the scope of the present invention.

Figure 1:
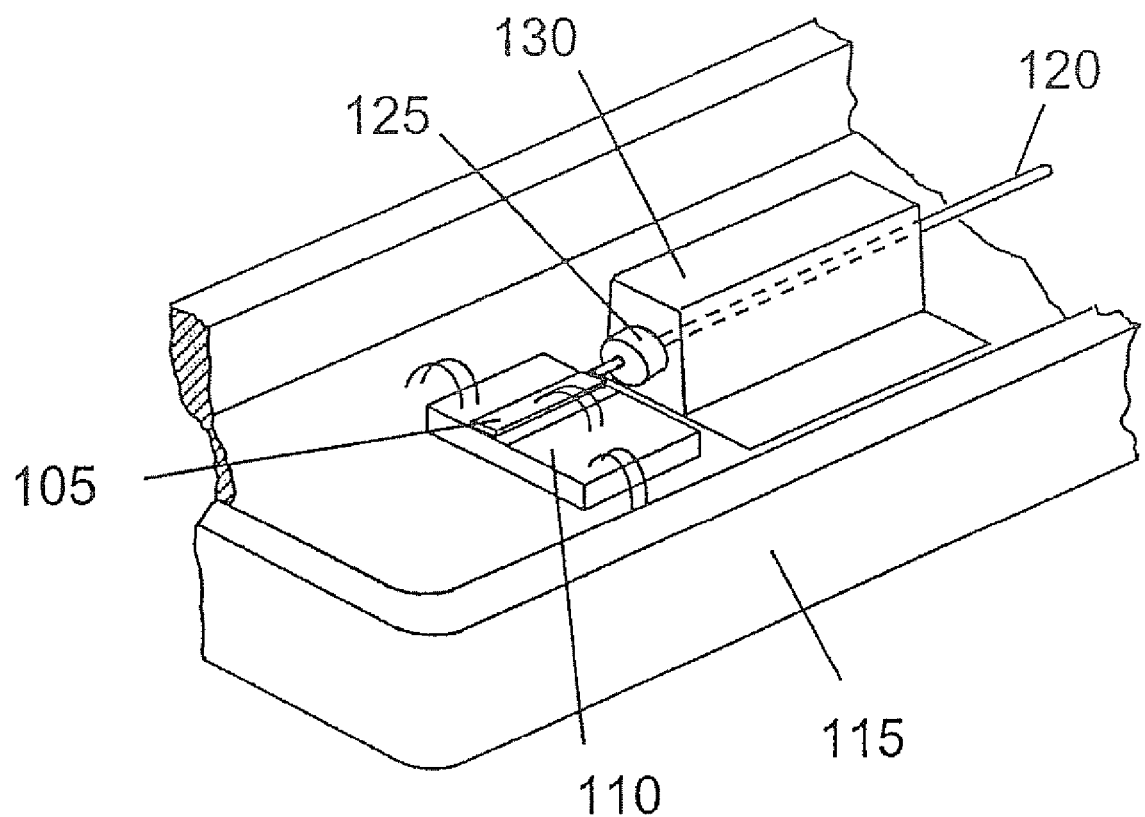
FIG. 1 is a symbolic diagram of a prior art diode laser pump source.
Figure 2:
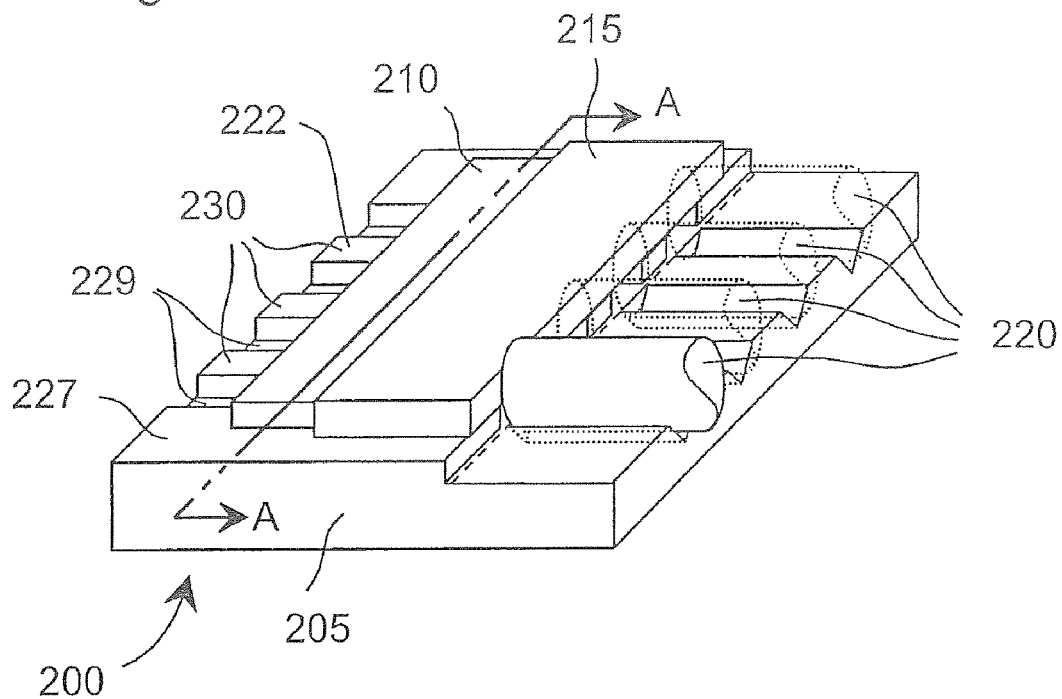
FIG. 2 is a symbolic diagram of a laser array pump source according to an embodiment of the present invention, shown without a protective package.
Figure 22:
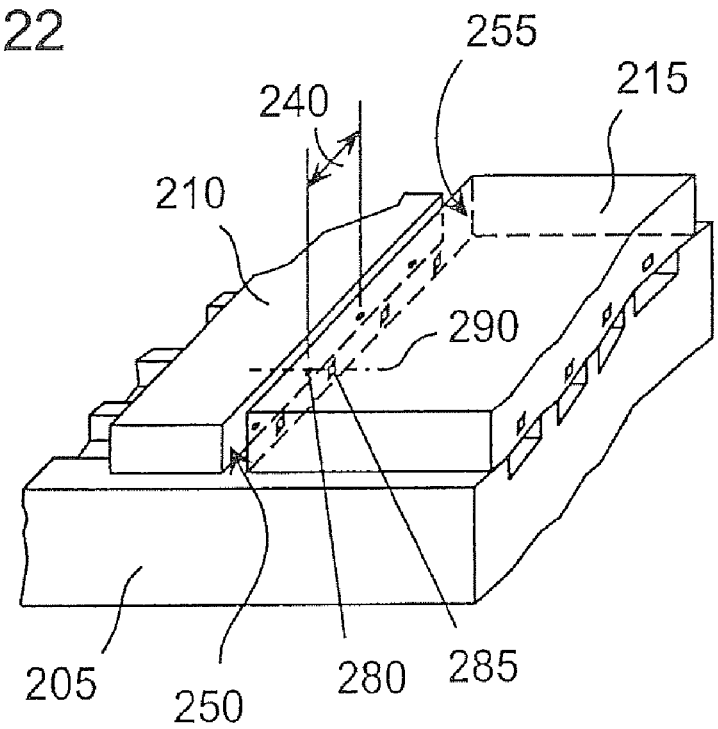
FIG. 22 is a fragmentary perspective view of the FIG. 2 embodiment, showing in particular the relationship between corresponding ports of the laser array and IO waveguide chip.

FIG. 2 illustrates an embodiment of a semiconductor diode laser pump source 200 in accordance with aspects of the invention. Pump source 200 is shown to include several major components: a submount 205, a diode laser array (hereinafter "laser array") 210, an integrated optic (IO) waveguide chip 215 and an optical fiber array 220. As used herein, an optical "array" is a device that includes two or more optical ports. The submount 205, laser array 210 and IO chip 215 are shown in greater detail in FIG. 22, which illustrates in particular opposing edges 250 and 255 of laser array 210 and IO waveguide chip 215. Laser array 210 and IO waveguide chip 215 are each provided with a plurality of optical ports 280 and 285 arranged along a respective subject edge 250 or 255. The optical ports may take the form of waveguide inputs and outputs, positioned such that the subject edges 250 and 255 of laser array 210 and IO waveguide chip 215 are substantially perpendicular to the optical axes 290 of the waveguide inputs and outputs, with the lateral spacing 240 in the horizontal dimension parallel to the subject edges being substantially the same in both components, at least at the subject edges. In this manner, the optical ports of laser array 210 and the optical ports of IO waveguide chip 215 can communicate with each other if they are arranged in such a way that a sufficient fraction of the optical energy emitted from one of the ports is captured by the other optical port. A condition of perfect alignment between corresponding ports, wherein the optical axes of the pair of corresponding ports are coincident, is not required. Rather, two ports "can communicate" with each other even if their optical axes are spatially or angularly offset, provided that such spatial and/or angular offset does not exceed a desired tolerance. Corresponding ports also "can communicate" with each other if the ports are aligned (or misaligned by no more than a desired tolerance) with an optical path that includes an optical redirector (such as a reflector, refractor, or re-emitter) positioned intermediate in the optical path between the ports. Similarly, as used herein, one optical port "can receive" optical energy from another optical port if the two optical ports "can communicate" with each other.

As is known in the art, laser array 210 is configured to emit light responsive to application of electrical signals thereto. The term "light" as used herein is not limited to visible light, but rather includes any optical energy having a wavelength or range of wavelengths suitable for a specified application. Light emitted by laser array 210 is coupled into the receiving end of IO waveguide chip 215, where a waveguide taper array may be used to convert the mode emitted by laser array 210 to that of a single mode optical fiber. IO waveguide chip 215 may also include other functionalities as described below, such as incorporation of distributed Bragg reflectors (DBRs) for wavelength stabilization, directional couplers for wavelength multiplexing, and switch networks for redundancy. At the output end of IO waveguide chip 215, the transmitted and mode-converted light is coupled into an optical fiber array 220 to be conveyed, for example, to the amplification regions of EDFAs. In accordance with an aspect of the present invention, assembly of the several components to form the pump source 200 is advantageously effected by simultaneous optical alignment of the emitters of laser array 210 to corresponding receiver waveguides fabricated in IO waveguide chip 215, followed by (or performed concurrently with) the alignment of optical fiber array 220 to the output end of IO waveguide chip 215. As is discussed in further detail hereinbelow, simultaneous alignment of the laser emitters to the corresponding receiving waveguides may be achieved by utilization of a submount 205 having a standoff structure 222 to which laser array 210 and IO waveguide chip 215 are attached.

As illustrated in FIG. 2, standoff structure 222 may comprise a set of discrete parallel standoffs 230 fabricated on and protruding vertically upward from a first major surface 227 of submount 205. Standoffs 230 terminate at their upper end in upper surfaces, at least a portion of which contact corresponding surfaces of laser array 210 and IO waveguide chip 215. As used herein, the term "vertical" is intended to mean substantially perpendicular to the major planes of submount 205, laser array 210 and IO waveguide chip 215. Areas of first major surface 227 lying between discrete standoffs 230 define an array of wells 229 or recessed regions of a depth suitable for receiving solder balls and/or adhesive (for example a glue, epoxy or other such bonding agent). The wells 229 may also carry circuit metallization traces and contact pads for electrical interconnects.

Standoff structure 222 may be fabricated on first major surface 227 of submount 205 by photolithographic and selective etching processes. Alternatively, standoff structure 222 may be fabricated by laser ablation, by depositing a layer of material and defining standoff structure 222 by photolithography and a solvent or etchant, by positioning and affixing material preformed in a predetermined thickness and shape, or by a combination of the foregoing techniques. Standoff structure 222 may alternatively be formed on the appropriate major surface of laser array 210 or of integrated optic waveguide chip 215, or partially on laser diode array 210 or the integrated optic waveguide chip 215, and partially on submount 205. As shown, discrete standoffs or ribs 230 extend primarily longitudinally on submount 205 (the longitudinal axis being in the horizontal plane of submount 205 and oriented substantially perpendicular to the subject edges of laser array 210 and IO waveguide chip 215).

Figure 3:
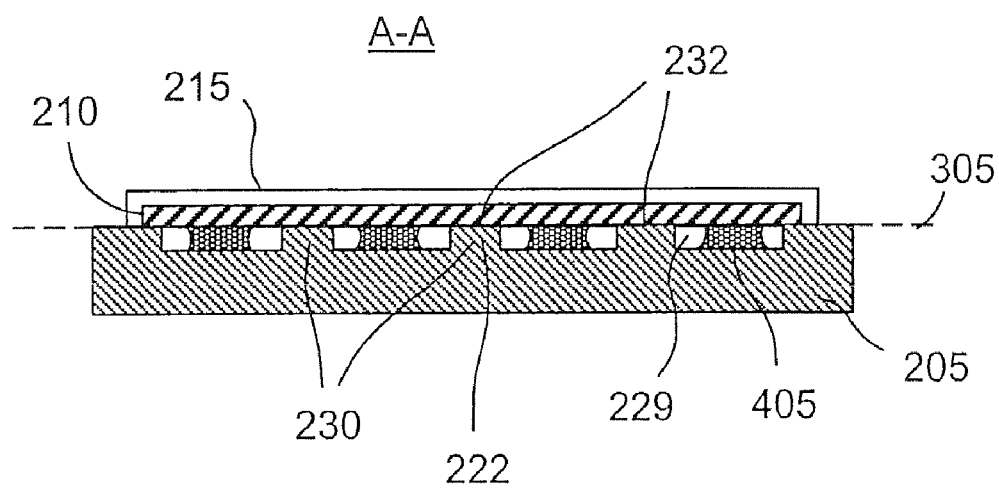
FIG. 3 is a cross-sectional view taken along line A-A in FIG. 2.
Figure 4:
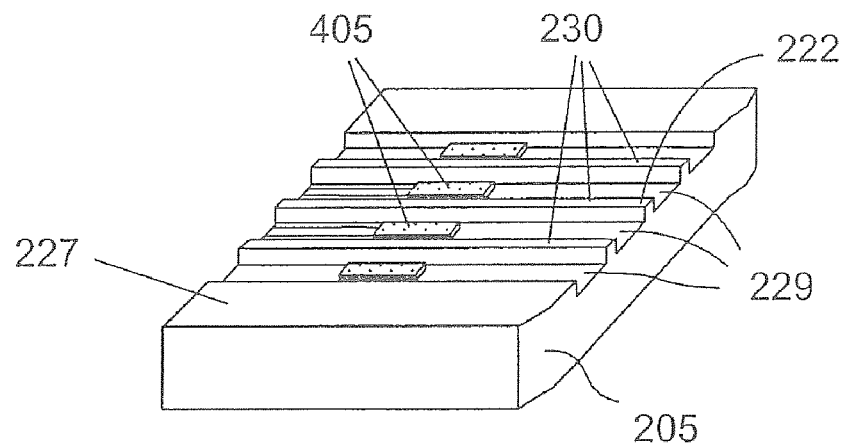
FIG. 4 is a fragmentary symbolic diagram of a submount according to an embodiment of this invention.

The function of standoff structure 222 is made clearer with reference to FIG. 3, which represents a cross-sectional view taken along the line A-A of FIG. 2, and with further reference to FIG. 4, which depicts a fragmentary perspective view of submount 205 in the absence of laser array 210 and IO waveguide chip 215. Ribs 230 contact laser array at a plurality of contact portions 232. Contact portions 232 collectively define a reference surface 305. Reference surface 305 will typically be substantially planar, although some implementations of the invention may utilize standoff structures which define a curved reference surface (i.e., a reference surface having a finite radius of curvature along the lateral and/or longitudinal axes). It will be appreciated that some portions of the standoff structure may be shorter than others, either intentionally or unintentionally, and those will not form contact portions with laser array 210 and do not count in the definition of the reference surface 305.

It should be noted that standoff structure 222 may be formed in a variety of geometries and is not limited to the parallel discrete rib design depicted in FIGS. 2-4. For example, standoff structure 222 may be formed as a continuous serpentine-shaped structure, or as a comb-type structure having a plurality of teeth joined at one end by a common spine. Irrespective of the exact shape which standoff structure 222 takes, it is preferable that at least three of contact portions 232 occur consecutively along a substantially straight line parallel and close to the subject edge of the chip being supported (i.e., laser array 210 or IO waveguide chip 215), and that those three contact portions 232 are mutually isolated from each other along that line in reference surface 305. Note that contact portions 232 may, however, connect with each other at locations not on such line, and therefore may not be entirely isolated from each other; but they should be mutually isolated from each other at least along some line in the reference surface 305 parallel to and in close proximity to the subject edge.

It is to be appreciated that, in the lateral dimension along the subject edge, contact portions 232 should be sufficient in number, spacing and extent to effectively define the curvature of the subject edge for a specified application. For many applications, the subject edge will have an infinite radius of curvature, i.e., will be linear. In the longitudinal dimension, contact portions 232 should be sufficient in number, spacing, extent and proximity to the subject edge that they control the curvature of the subject edge adequately for the desired application. It is preferable that at least one contact portion included under the optical component 210, 215 is sufficiently close to the subject edge to define the vertical angles of the optical axes of each of the optical ports adequately for the desired application.

It should be appreciated that the present invention does not require a uniform height for all elements of standoff structure 222. In some embodiments, required curvatures and optical axes' angles are best achieved with non-uniform standoff structure heights. For example, a standoff structure may comprise a stepped standoff structure comprising a first set of standoffs having a first height, and a second set of standoffs having a second height different from the first height. The first set of standoffs may then be utilized to support laser array 210, and the second set of standoffs may be utilized to support IO waveguide chip 215. In this case, it should be noted that the two reference surfaces defined by the first and second sets of standoffs are not co-planar. The stepped standoff structure design may be useful in achieving vertical alignment of optical ports when laser array 210 and IO waveguide chip 215 have substantially different thicknesses. In addition, the stepped standoff structure may provide a physical stop which enables precise longitudinal positioning of IO chip 215, thus facilitating butt coupling to laser array 210. It will be apparent to one skilled in the art that protrusions functioning as physical stops may be incorporated, where desired, into standoff structures having an otherwise uniform height.

It should be further noted that contact portions 232 of the standoff structure 222 that are under one optical component, for example laser array 210, can be either continuous with or discontinuous (distinct) from corresponding contact portions located under the second optical array component, for example IO waveguide chip 215. Standoff structure 222 should be substantially rigid, at least along the longitudinal axis thereof, to achieve proper alignment of the optical ports of laser array 210 and IO waveguide chip 215. In the vertical dimension, standoff structures should have sufficient rigidity to withstand the pressures exerted by the chuck pressing against it, as described elsewhere herein. If the pressures are exerted at elevated temperatures, which might be the case if certain bonding agents such as solder are being used, then the vertical rigidity of the standoff structure should be maintained even at the elevated temperature. In this sense, a solder bump which is liquified during mounting does not qualify as part of a standoff structure.

As used herein, the terms "top," "bottom," "lower" and "upper" and the like are used solely for convenience in referring to particular levels. The levels they refer to are not intended to change if the structure is turned upside down or tilted.

It is further noted that the output light emerging from the emitters of laser array 210 diverges rapidly. The rate of this divergence is inversely related to the dimension of the optical mode within the waveguide cavity. For optimally efficient operation of the laser diode emitters, the multiple layers composing the gain (or diode junction) and waveguiding regions in the semiconductor chip are constructed such that the optical mode is tightly confined, with typical optical mode diameters of 1 μm in the vertical dimension (perpendicular to the plane of the diode laser junction) and 3 μm in the lateral dimension transverse to the optical axis of the diode laser waveguide. Thus the laser diode output diverges faster in the vertical dimension perpendicular to the plane of the laser diode junction, compared to the divergence rate in the lateral dimension. This small vertical dimension and the corresponding rapid divergence makes the vertical alignment between two such waveguides the most critical, i.e. having the smallest allowable misalignment tolerance for efficient coupling.

To achieve accurate alignment between the emitters of laser array 210 and the corresponding waveguides of IO waveguide chip 215, standoff structure 222 defines a reference surface 305, as illustrated by and described earlier in connection with FIG. 3. This reference surface 305 is used to accurately align the optical axes of the emitters of array 210 and the receiving waveguides of the integrated optical waveguide chip 215 in the critical vertical dimension. This approach preferably employs a flip-chip bonding technique, which involves bonding components of pump source 200 with the active surface (also variously referred to as the "top", "upper" or "circuit" surface) of the component facing submount 205. According to typical construction methods of IO devices (such as laser array 210 or IO waveguide chip 215), several devices of a given type are typically fabricated simultaneously by photolithographic and planar processing techniques on a single wafer, which is then separated into identical smaller units referred to as chips, components, or devices. As a consequence of the method of construction, the active and passive optical and electronic circuit structures of the devices, such as waveguides, p-n junctions, and other structures known in the art, are typically disposed near one major surface of the IO component, herein referred to as the "active" side.

Both laser array 210 and IO waveguide chip 215 are preferably designed and fabricated such that the centroids of the optical modes of each are located at a very well known distance from the respective active surfaces. For laser array 210, this condition may be accomplished by the use of controlled epitaxial growth of substantially planar layers on a planar substrate, which are then processed with lithographic techniques to define the active region. For IO waveguide chip 215, this condition may be achieved by using the carefully controlled indiffusion of a species into the surface of a planar substrate, e.g., diffusion of protons into lithium niobate. Typically, the distance in the vertical dimension between the centroid of the optical mode and the active surface in laser array 210 will be different than the corresponding distance in IO waveguide chip 215. To correct for this difference, a thin film material of an appropriate thickness may be deposited on the active surface of one of the components (i.e., the component having the smaller centroid-to-surface distance) such that the two distances are rendered substantially equal. The thin film material may comprise, for example, SiO2 deposited by sputtering, or by ion beam assisted deposition, which technique enables control of the film thickness to an accuracy of a few nanometers. The thin film material may alternatively be a metal such as gold. Preferably, the thin film material is patterned into discrete pads spatially corresponding to some or all of contact areas 232. Well-known photolithographic techniques, such as photoresist liftoff or etching with photoresist protection, may be used to pattern the pads. Alternatively, the pads may be patterned by deposition through a shadow mask. The patterning serves to provide pads with sufficient area to support the associated component (e.g., IO waveguide chip 215), while minimizing any stress resulting from thermal expansion mismatch between the component and the thin film material. Other techniques which may be used to compensate for differences in the centroid-to-surface distance include interposing, during assembly, preformed metal pads of appropriate thickness between the component having the shorter-centroid-to-surface distance and the underlying portions of standoff structure 222.

Assembly of laser array 210 to submount 205 may be performed according to the following process. As described above, standoff structure 222 is prepared on a first major surface 227 of submount 205. If desired, a suitable solder 405 may be deposited into wells 229 defined by ribs 230 of standoff structure 222, as illustrated in FIG. 4, to enable bonding of diode laser array chip 210 to submount 205. In another embodiment the adhesive is placed in recesses laterally outside the standoff structure. Laser array 210 and submount 205 are next placed on respective chucks within a flip chip bonder. At least one of the chucks of the bonder preferably provides a compliant or deformable layer as described in detail below. Laser array 210 and the submount 205 are brought into initial alignment, which may be preformed, for example, by using a combination of optical alignment and fiducial marks for lateral and in-plane (yaw) angular alignment, and an autocollimator to set parallelism (roll and pitch angular alignment). The flip chip bonder is then used to bring the top or active surface of laser array 210 into contact with the reference surface 305 defined by standoffs 230. As it is practically impossible to orient the laser array 210 and the submount 205 in perfectly parallel relation, especially when one considers that the fabrication process of the laser array 210 generally results in a warped or bowed chip, one portion of the active surface of laser array 210 will contact the corresponding area of standoff structure 222 before remaining portions of the active surface are brought into contact with standoff structure 222.

Following the establishment of initial contact between laser array 210 and standoff structure 222, force is applied by the flip chip bonder to bring the chucks holding submount 205 and laser array chip 210 still closer together, thus pressing laser array 210 onto reference surface 305 of standoff structure 222. Force is transmitted to laser array 210 through a compliant or deformable layer disposed between the laser array chip 210 and the metal (or ceramic) chuck which holds the chip 210. This compliant layer can be compressed and distorted, thereby distributing the applied force over the area of the laser array chip 210 and permitting it to flex and/or rotate such that it becomes substantially uniformly contacted to the reference surface 305 across its entire area. The distributed applied force is sufficient to rotate the laser array chip 210 to overcome any remaining nonparallelism.

In essence, laser array 210 is pressed onto standoff structure 222, optionally deforming laser array chip 210 or submount 205 or both from its or their originally provided shape, until the resulting curvature of the laser array chip 210 substantially matches the resulting curvature of reference surface 305. Once such uniform contact is achieved the flip chip bonder may be used to heat the two components to a temperature sufficient to cause solder 405, which was previously deposited in wells 229 between stand-offs 230, to ball up and contact laser array 210. On cooling, solder 405 solidifies and the force applied by the flip chip bonder may be released. The solder forms a strong bond between laser array 210 and submount 205 which may be used for both mechanical support and, if desired, electrical connection between the laser diode drive circuitry and the laser emitters themselves, and also for providing a good thermal contact for cooling.

It will be noted that the combination of the standoff structure 222 and the compliant layer disposed between laser array 210 and the chuck of the flip chip bonder enables uniform contacting of the laser diode array, to the reference surface 305 defined by standoff structure 222, across the entire width of laser array 210. Thus, all the emitters of the laser diode array 210 are accurately located relative to the reference surface 305. This location is achieved independently of the presence of curvature or warping in either the submount 205 or the laser array chip 210, both as originally provided and as finally bonded.

It will also be noted that the position of the emitters relative to reference surface 305 is determined only by the accuracy of thickness control in the layer deposition and formation processes used to construct laser array 210. There is no solder or adhesive located between the active surface of laser array and the contact portions 232 of standoffs 230; rather, the solder or adhesive 405 is located in the wells 229 between the standoffs 230, and so variations in the thickness or volume of solder 405 deposited on the submount 205 do not affect the alignment of the laser diode array 210.

In addition, the use of standoff structure 222 comprising a set of standoffs 230 arranged across the width of laser array 210, advantageously reduces the actual contact area between laser array 210 and submount 205 compared to an assembly wherein the entire planar surface of laser array 210 is contacted with a corresponding planar surface of the submount 205. This reduced contact area decreases the probability of a material defect or foreign object (e.g., a dust or debris particle) being located between the laser array 210 and the submount 205 at a point of contact, and therefore decreases the probability of a resulting misalignment that will adversely affect the coupling efficiency. As shown in FIG. 2, the aggregate contact area between the standoffs 230 and each of the optical array components (i.e., laser array 210 and IO waveguide chip 215) is substantially less than the total area by which the submount 205 overlaps each such optical array component. The overlap area is defined herein as the intersection area of a perpendicular projection of the optical components onto submount 205. The aggregate contact area is preferably less than 50 percent, and more preferably less than 10 percent, of the corresponding overlap area in order to minimize misalignment arising from defects or the presence of foreign particles.

Attachment of IO waveguide chip 215 to the submount 205/laser array 210 subassembly (hereinafter "subassembly") may be performed by a method closely similar to the above-described method for attaching laser array 210. However, active alignment techniques may be employed for positioning of IO waveguide chip 215, as is set forth below.

During the attachment procedure, the subassembly may be mounted on a fixed or movable stage and provided with electrical connections to driver circuitry to energize the laser emitters. IO waveguide chip 215 is preferably mounted with its active or top surface (at or proximal to which are located the waveguides) facing the standoffs 230 fabricated on the major surface 225 of the submount 205, with the receiving ends of the waveguides facing corresponding emitters of laser array 210. IO waveguide chip 215 may be mounted in a suitable holder attached to a computer controlled multi-axis micropositioner capable of submicron positioning accuracy and repeatability, such as an autoalign system. IO waveguide chip 215 is initially aligned relative to the assembly using optical alignment and fiducial marks to set lateral and longitudinal position and yaw angle, and an autocollimator to set parallelism to submount (roll and pitch angles). IO waveguide chip 215 is then brought into close proximity to standoffs 230, with the receiving end of IO waveguide chip 215 located adjacent to the emitting edge of laser array 210. It will be understood that this alignment approach is based on butt coupling between the laser array 210 and IO waveguide chip 215, requiring close approach of the facets of the two components to prevent diffraction losses between the two. Energizing laser array 210 results in the emission of light from the emitters, which is captured by the receiving waveguides in IO waveguide chip 215. A photodetector (or array of detectors) is used to monitor the light transmitted through IO waveguide chip 215. The position of IO waveguide chip 215 is then adjusted under computer control to maximize the transmitted light. Importantly, adjustment need be performed only in the lateral, longitudinal and yaw dimensions since the vertical position and the pitch and roll angles are defined by standoff structure 222. Once alignment is optimized (as indicated by maximization of the light transmitted through the waveguide(s) of IO waveguide chip 215), the position of the chip may be memorized by the computer control system, and the IO waveguide chip 215 withdrawn to allow the dispensing of adhesive (e.g., an epoxy) into wells 229 located between standoffs 230. Alternatively, solder deposited into wells 229 can be used to provide mechanical fixing, if appropriate portions of IO waveguide chip 215 have been metallized. After deposition of the epoxy, IO waveguide chip 215 is returned to its exact previous position using the highly accurate repeatability of the positioning stages. Final alignment is confirmed and IO waveguide chip 215 is contacted and pressed onto standoff structure 222 using the micropositioners. If an epoxy is employed to provide adhesion between IO waveguide chip 215 and submount 205, the epoxy is subsequently cured, e.g., by UV exposure. Note that the mount supporting IO waveguide chip 215 on the micropositioner is preferably designed to be compliant or deformable such that when IO waveguide chip 215 is contacted to standoff structure 222, IO waveguide chip 215 is allowed to roll or pivot and flex if necessary to conform to the reference surface defined by standoff structure 222, and/or to remove any warpage or bowing in IO waveguide chip 215. Alternatively, a passive optical process may be employed.

By attaching IO waveguide chip 215 in this manner, it can be understood that high coupling efficiency between the emitters of laser array 210 and the waveguides of IO waveguide chip 215 can be achieved, as the crucial vertical alignment of corresponding emitting and receiving optical port is performed passively and with very high accuracy.

Following alignment and attachment of IO waveguide chip 215, the light transmitted through IO waveguide chip 215 may be coupled into an array of (preferably single mode) optical fibers. The optical fibers may for instance be assembled in a silicon v-groove array as known in the art to accurately define the spacing between the fiber cores, and to position the fiber cores along a substantially straight line in the lateral dimension. Simultaneous alignment of all of the IO waveguide chip 215 outputs into respective optical fibers may be achieved in a single active alignment step, where the position of the optical fiber array relative to the output facet of the IO waveguide chip is adjusted to maximize the light transmitted through the fibers to a photodetector. Once the alignment has been completed the position of the fiber array may be secured using, for instance, UV cured epoxy, solder, thermally cured epoxy, laser welding etc. to bond it to submount 205 or alternatively, to the output facet of IO waveguide chip 215.

In general, the alignment tolerances for optical coupling between the output waveguides of IO waveguide chip 215 and the fiber array are considerably looser (i.e., greater) than those required for acceptable coupling between the diode laser and the input waveguides of the IO waveguide chip or between the diode laser and a lensed or chisel-tipped optical fiber. The looser tolerances are due to the difference in mode sizes between those in laser array 210 and the fiber array: in a typical implementation of pump source 200, the optical mode in a single mode optical fiber has a characteristic vertical dimension in the range of approximately 6 μm (for a fiber carrying 980 nm light) to 9 μm (for a fiber carrying 1480 nm light) fiber, as compared to an optical mode having a characteristic vertical dimension of approximately 1 μm in laser array 210. To accommodate the larger mode size of the optical fiber, the mode size is expanded in the IO waveguide chip, from a small size matching the diode laser mode at the input waveguide, to a larger size matching the optical fiber mode, at the output waveguide. A small misalignment (e.g., on a submicron scale) reduces the overlap between optical modes that are several microns in size by only a small fraction and, accordingly, has only a minor effect on the coupling efficiency between a fiber array and an IO waveguide chip with matching mode size. In contrast, the same amount of misalignment would have a major effect on the coupling efficiency between a laser diode array and an IO chip or fiber array due to the much smaller mode sizes involved. It is also possible to perform alignment of the fiber array using a standoff designed reference surface as used for the diode laser-IO waveguide chip alignment, as described in detail below.

An embodiment of the invention will now be described in terms of specific exemplary implementations thereof. It will be appreciated that the following implementations are intended to be illustrative rather than limiting.

In a first exemplary implementation of diode laser pump source 200, laser array 210 is configured to emit light at a wavelength of around 980 nm. Laser array 210 may be fabricated from epitaxially grown layers of AlGaAs or InGaAs as known in the art. As discussed above, laser array 210 comprises a plurality of individual emitters arranged in mutually parallel fashion. The total number of emitters may vary over an extended range (between 2 and several hundreds, inclusive) depending on requirements of a specific application, but will typically lie in the range between 4 and 64, inclusive. Each emitter preferably lases in a single transverse mode, known in the art as the (0,0) mode. The position of the centroid of the laser mode relative to the active surface of laser array may be determined either from optical measurements of the output mode pattern or from computations based on the refractive indices and thicknesses of the layers grown to form the laser junction and waveguide structure. This position may readily be determined to fractions of 1 μm.

Laser array 210 may be fabricated by methods known in the art involving the photolithographic patterning of precisely grown epitaxial layers to define the laser structure. Electrical contacts are applied by other techniques known in the art to ensure ohmic contact to the laser junction and to the backside of the wafer for the current return path. The laser arrays are then cleaved from the wafer to prepare the emission facets and cleaved or diced to size laterally to define the number of emitters per array. Lithographically defined alignment marks may be provided to guide the location of the cleaving steps. Suitable coatings may be applied to the cleaved or etched facets of the laser array to improve lifetime and to provide preferential emission of the output radiation from the output facet. Typically the output facet is coated to provide a relatively low reflectivity (1-30%) to provide the output coupling from the laser diode cavity, while the other, or back facet, is typically coated with a high reflectivity layer (for example, greater than 90%). Preferably the individual diode laser emitters are fabricated at a sufficient lateral spacing to minimize thermal cross-talk between emitters and to enable efficient heat extraction from the laser array without requiring an excessive laser diode junction temperature. The maximum optical output power should be chosen to remain below the threshold for catastrophic optical damage at the output facets of the emitters. In one implementation, the maximum output power of each individual emitter is in the range of 50-500 mW.

The submount 205 may preferably be fabricated from single-crystal silicon. Alternatively, materials such as lithium niobate and beryllium oxide may be used to provide a closer thermal expansion match to the GaAs material of the laser diode array. The submount material is preferably chosen to exhibit high thermal conductivity in order to enable efficient extraction of heat generated by the laser emitters during operation. In the case of a single-crystal silicon submount material, standoff structure 222 may be defined using photolithographic patterning and wet etching of the silicon wafer surface. The upper surface of standoff structure 222 comprises the unetched regions of the original surface of the silicon wafer and therefore retains the original surface's smoothness and flatness. The height of standoff structure 222, is determined by the etch processing conditions of time, temperature and etch agent (among others) and may be controlled to sub-micron accuracy. In a typical implementation of submount 205, the height of standoff structure 222 will be around 5 μm.

Alternatively, for both silicon and the alternative materials (lithium niobate and beryllium oxide) standoff structure 222 may be fabricated using the deposition of thin film materials over the surface of the original wafer. For instance, a layer of $SiO_2$ or SiN may be deposited by RF sputtering, PECVD, ion beam assisted deposition, or other process as known in the art, with very well controlled absolute thickness (±10's of nm) and excellent uniformity across the wafer (<±0.5%). Standoff structure 222 may then be formed by photolithographic patterning and etching of the thin film layer(s). For instance, in the case of $SiO_2$, a photoresist layer may be spun onto the thin film, exposed through a mask carrying the desired standoff pattern and developed. The patterned resist layer may then be used as a mask to etch the $SiO_2$ layer for instance using a wet buffered oxide etch or a dry etch, e.g. reactive ion etching in $CHF_3$. The height of standoff structure is determined by the thickness of the film layers deposited on the surface. By depositing layers of different materials sequentially with controlled thickness, and then using chemically selective etching it is possible to construct a standoff structure having regions of different heights.

Wells 229 disposed between standoffs 230 may be utilized as reservoirs for a bonding agent to attach laser array 210 to submount 215. Electrical traces may also be disposed on the submount surface between the standoffs 230 such that electrical contact may be made to the emitters of laser array 210. In some instances it may be desirable for the electrical traces to enable individual connections for each emitter so that the operation and power output of each emitter may be controlled independently using suitable external drive circuitry. In others it may be desirable to gang several or all of the emitters together on common electrical connections. Either of these situations can readily be accommodated by the wafer scale photolithographic processes used to image and pattern the traces on the submount. For some choices of submount material, such as silicon, it may be necessary to provide an electrical isolation layer beneath the electrical traces to prevent short circuits and current leakage through the bulk of the submount.

Metal pads may be fabricated in selected wells which correspond to bonding and/or electrical contact areas on laser array 205. These metal pads may be coated with a layer of solder, e.g. and indium based solder deposited by evaporation or electroplating, or a gold-tin solder deposited by evaporation. The thickness and area of this solder is chosen such that it does not completely fill (either vertically or laterally) the well, but so that when it is melted it can ball up due to surface tension and contact the surface of a component being held against the reference surface defined by the standoff array. The type of solder to be used for this attachment is defined by the performance requirements of the assembled device. At a minimum the solder must remain solid and maintain a robust physical and/or electrical attachment throughout the desired operating and storage temperature range of the device, typically about −35° C. to about +85° C.

The fabrication of submount 205 may readily be performed on a wafer scale using standard planar lithographic processing techniques as known in the art. Once the fabrication processing is complete the individual submounts may be cut from the wafer using a dicing saw. As shown in FIGS. 2-3, the submount 205 may be sized such that it does not extend beyond the output end of IO waveguide chip 215, in order to facilitate the approach of the output fiber array to the output facet of the IO waveguide chip 215 as described below.

Attachment of laser array 210 to submount 205 may be performed using a modified flip chip bonder. The prepared submount with standoffs, electrical connections, solder preforms and lithographically patterned optical alignment or fiducial marks is loaded onto the substrate chuck of the bonder and held in place typically with vacuum pull from the backside. The prepared laser array, with electrical and bonding contact pads and facet coatings, is loaded into a specially modified sample chuck on the flip chip bonder.

The chuck is modified such that interposed between the laser array chip and the metal or ceramic chuck is a layer of compliant or rubber like material. This material, for example, a polyimide, a silicone rubber, or a fluoroelastomer such as Viton® (manufactured by DuPont Dow Elastomers), is deposited on the chuck and subsequently processed to yield a flat surface, e.g., by lapping and polishing on a flat plate with progressively finer polishing compounds. Vacuum holes are formed in the compliant layer to match those present in the standard chuck to provide a holding force to secure the array chip.

After loading laser array 210 and submount 205, an autocollimator is used to align the two components approximately parallel in the pitch and roll axes, and lateral, longitudinal and yaw angle adjustments are made to position laser array 210 correctly with respect to the alignment marks on submount 205, such that the electrical and/or attachment contact pads on laser array 210 will align with respective features on submount.

The two chucks are then brought close together such that laser array 210 contacts standoff structure 222. In general, the angular alignment of laser array 210 and submount 205 is imperfect, and laser array 210 often is warped or bowed due to stresses introduced during the fabrication processing, such that one point or line on laser array 210 contacts the standoff structure before remaining portions. At this point, the compliant layer between laser array 210 and the sample chuck is compressed or distorted, accommodating angular misalignment, and allowing laser array 210 to rotate and/or flex such that it comes into substantially uniform contact with standoff structure 222. Although the compliant layer allows the rotation/flexing of laser array 210 to contact the standoff structure, it preferably resists lateral displacements or motion that would otherwise cause lateral or longitudinal misalignment of laser array 210 with respect to submount 205. After contact is achieved the vacuum hold on laser array 210 may be released if desired.

Subsequent to contact (or if preferred before contact is complete or during the contacting process) the temperature of the components is raised sufficiently high to melt the solder which was previously deposited and patterned in wells. On melting, the solder preferably balls up until it contacts and wets the contact pads on laser array 210. Fluxes and other processes such as forming gas or formic acid vapor may be used as known in the art to improve the solder flow, wetting and adhesion properties. The subassembly is then cooled to harden the solder. If it has not already been released the vacuum hold on the sample may be removed during or after the cool down cycle.

Once cool, the subassembly may be removed from the flip chip bonder for further processing. Electrical connections to the active side of laser array 210 are preferably made by the solder joints described above. Electrical connection to the backside of laser array 210 to provide the current return path may be made by placing wire bonds from metallized pads on the backside of the semiconductor wafer to bonding pads located on the submount.

In the presently-described implementation, IO waveguide chip comprises a lithium niobate (LN) crystal with waveguides fabricated therein using an annealed proton exchange (APE) method. Preferably the LN crystal is X- or Y-cut such that the waveguides support a TE polarization mode that matches the output polarization of typical laser emitters. Alternatively, a TM polarized diode laser may be used, coupled to an APE waveguide in Z-cut lithium niobate, which also supports a TM polarized mode. In alternate implementations, IO waveguide chip 215 may be formed using other suitable optical materials and methods of waveguide fabrication, including without limitation, ion exchanged or indiffused glass, multi-layer polymer stack, or silica-on-silicon structures.

The receiving or input end of IO waveguide chip 215 is adapted with an array of waveguides that having lateral spacing matched to that of the laser array 210 emitters. In addition, the waveguide dimensions and process parameters (such as anneal time/temperature) are chosen so as to create a very tightly confined optical mode with mode dimensions similar to that of the emitters (typically around 1 μm in the vertical dimension and 3 μm in the lateral dimension). The tightly confined waveguide mode in IO waveguide chip 215 assures a high overlap integral between the laser array 205 output mode and the IO waveguide chip 215 input mode when the facets of the two chips are brought into close proximity in the butt coupling procedure described below. In practice, the actual mode size in the input waveguides of IO waveguide chip 215 may be somewhat larger than that of the laser array 210 emitters due to process constraints.

A primary function of IO waveguide chip 215 is to act as a mode size converter between laser array 210 and the single mode optical fibers employed at the output of pump source 200. Tapered waveguide sections are used for this purpose, according to known art, and it is in general possible to create almost any desired mode size by appropriate choice of physical mask dimensions, proton exchange time and temperature, and annealing time and temperature.

The waveguide taper structure may be constructed in a single processing step, with a single set of exchange and anneal parameters and one lithographically defined mask. Alternatively the taper structure may be constructed in several sequential steps using multiple exchanges, anneals, and masking steps. The single step construction method may not enable full optimization of the waveguide mode size at the extreme input and output regions of IO waveguide chip 215, but it offers a far less complicated process than the sequential method, which requires several critical alignments. An example of single-step constructed waveguide taper structure formed in IO waveguide chip 215 is a 4 μm wide mask dimension at the input/receiving end which tapers down to a 2 μm wide mask dimension at the output end. The wider channel at the input creates a well-confined small mode, while the reduced lateral dimension of the waveguide mask at the output end significantly reduces the total number of protons added to the substrate in the same proton exchange and anneal, and thus provides a waveguide core at the output that has a smaller refractive index. Consequently a much more weakly confined waveguide is produced at the output end of the taper, having a mode that is well matched to that of a single mode optical fiber. If desired, further optimization of the mode sizes in the vertical dimension to maximize mode overlap and coupling efficiency at the input and output may be achieved by the addition of thin film layer sections to the surface of IO waveguide chip 215. For example, a layer of high index $Nb_2O_5$ may be provided at the receiving end to confine the waveguide mode strongly near the surface of the chip; or a layer of $SiO_2$ (or $SiONx$), at the output end, to effectively bury the waveguide and force the mode down, away from the surface of the LN crystal, making it more symmetrical. Preferably, the waveguide structure is also designed to be adiabatic, supporting only a single lowest order (0,0) mode throughout its length, so that excess loss due to mode conversion is minimized or eliminated.

It is known in the art that waveguides with very tight confinement and small mode sizes often exhibit high propagation losses. It is therefore preferable for the tightly confining receiving end section of the waveguide to be as short as possible, and for the waveguide dimensional taper to start very close to the receiving facet. In principle it is possible to reduce the taper length to under 500 μm whilst maintaining low-loss tapering of the waveguide.

After fabrication of the waveguide structures, it is desirable to apply well controlled thin film layers to the surface of the wafer corresponding to the top or active surface of IO waveguide chip 215, such that the centroid of the intensity profile of the optical mode of IO waveguide chip 215 is located at the same distance below the effective wafer surface (that is, the surface of the thin film layer deposited on the wafer) as the centroid of the mode of the emitters of laser array 210. Alternatively, the thin film may be applied to merely provide for optimum optical coupling to be achieved irrespective of the optical mode centroids. The required thickness of material may range from 0.1 μm to several microns, preferably controlled to better than 0.1 μm in absolute thickness and in uniformity. A suitable material for this layer is $SiO_2$, deposited for instance using ion beam assisted deposition which enables exceptionally high uniformity and tight deposition thickness control up to tens of nanometers. The exact layer thickness required to match the centroids of the modes of laser array 210 and IO waveguide chip 215 may be determined from experimental measurement or from modeling. The height matching layer described above may also serve the purpose of preventing dirt and debris from coming into direct contact with the surfaces of the optical waveguides.

In addition to carrying the mode converting tapered waveguide structure, IO waveguide chip 215 may also be provided with alignment and fiducial marks referenced to the waveguide positions, for instance fabricated by planar photolithography and etching of a thin metal layer deposited on the crystal surface. These marks may be used for initial alignment during the attachment process described below. They may also be used to define dicing and polishing markers so that the end faces of IO waveguide chip 215 may be cut and polished to enable end-face launching of laser light into the waveguide facets. Such cutting and polishing is a routine process that is well understood in the art, with a requirement that the angles of the polished face with respect to both the longitudinal waveguide axes and the active surface be accurately controlled.

After dicing and polishing, it is preferable that anti-reflection (AR) coatings be provided on the input and output end facets of IO waveguide chip 215. LN has a high refractive index (approximately 2.2) and consequently light incident on a surface of an uncoated LN crystal will experience a significant amount of Fresnel reflectance. To maximize the amount of light coupled into and through the waveguides of IO waveguide chip 215, it is desirable to minimize the amount of reflection. To achieve this objective, an anti-reflective (AR) coating comprising a multi-layer stack of alternating $SiO_2$ and $TiO_2$ layers may be deposited on the appropriate surfaces of IO waveguide chip 215. As is known in the art, the number and thicknesses of the layers in the stack are adjusted according to the refractive index of the substrate being coated. Residual reflections may be thereby reduced to values as low as 0.01-0.1%, depending on the complexity of the coating structure and the optical bandwidth over which it must provide the anti-reflection function. In addition to maximizing the amount of light coupled into and out of the waveguides in IO waveguide chip 215, the AR coating also minimizes unwanted back reflections into the emitters of laser array 210, which may otherwise distort the lasing properties and cause unwanted fluctuations in emission wavelength and/or output power.

The prepared IO waveguide chip 215 may be aligned and attached to the submount 205/laser array 210 subassembly as follows. The submount/laser array subassembly is mounted on a holder and connected to an electrical drive circuit to enable the laser emitters to be energized. This electrical connection may either be temporary with zero-insertion force connectors or the like, or may involve mounting and wirebonding of the submount/laser assembly to some other carrier structure.

IO waveguide chip 215 is mounted in a specially designed holder and held in place using vacuum force or other suitable technique, with the active surface facing submount 205. Preferably, the chip holder is attached to a six-axis motion control system, such as an autoalign system, providing computer controlled motion and positioning with sub-micron accuracy (≦0.1 μm) in the three orthogonal displacement axes and the three angular axes. Initial alignment of IO waveguide chip 215 to standoff structure 222 is achieved using a combination of an autocollimator to adjust pitch and roll angles, and optical alignment marks to provide longitudinal, lateral and yaw adjustment.

IO waveguide chip 215 is then brought into close proximity to standoff structure 222, with the receiving facet of IO waveguide chip 215 brought into close proximity to the output or emitting facet of laser array 210 so as to enable butt coupling of the emitted laser light. Laser array 210 is energized to emit light by the application of an electrical signal from the above-mentioned drive circuit. At the output end of IO waveguide chip 215 may be located one or more lenses disposed to direct and focus light emitted from one or more waveguides in IO waveguide chip 215 to one or more photodetectors configured to monitor the power emitted from the waveguides of IO waveguide chip 215. The position of IO waveguide chip 215 is adjusted using computerized techniques in order to maximize the optical power transmitted through the waveguides. During final coupling optimization IO waveguide chip 215 is preferably contacted to standoff structure 222, allowing final setting of the lateral, longitudinal and yaw dimensions while constraining vertical, pitch and roll motions.

Note that the holder supporting IO waveguide chip 215 is preferably designed to allow a degree of flex or distortion in the position of the chip in response to pressure applied thereto. In this manner the holder may be designed with roll centers and pivot points such that, as IO waveguide chip 215 first contacts standoff structure 222, it is able to roll or flex sufficiently that it contacts standoff structure 222 substantially uniformly across its entire width, in a similar way as the compliant layer disposed between laser array 210 and the flip chip bonder chuck enables uniform contact between laser array 210 and standoff structure 222 even in the presence of initial misalignments and bowing or warping of the array itself. This holder may incorporate strain gauges and flexure structures in the mounting arms such that the strain in the holder may be monitored to determine when contact between IO waveguide chip 215 and standoff structure 222 has occurred.

Once optical coupling has been optimized, IO waveguide chip 215 must be securely attached to the submount. This function may be performed using a UV curing adhesive, such as an epoxy, in the following manner. First, the position of IO waveguide chip 215 is stored in memory by the computer control system, and IO waveguide chip 215 is then withdrawn from contact with submount 205. An epoxy dispense system may then be moved into position over submount 205 and controlled volumes of epoxy dispensed into specified wells 229. IO waveguide chip 215 is then repositioned at the stored location, and (if necessary) fine adjustments of the position and orientation of waveguide chip 215 are effected to re-optimize optical coupling between laser array 210 and IO waveguide chip 215 (noting that the precise positional repeatability of commercial computer control systems, which is typically around 0.1 µm, generally obviates the need to perform such re-optimization). The epoxy may then be cured using exposure to UV or short wavelength visible light which may be transmitted through IO waveguide chip 215. Those skilled in the art will recognize that it is important to choose an epoxy that exhibits good adhesion to the contact materials, that is the submount, the IO waveguide chip 215 surface and/or any thin film materials deposited on IO waveguide chip 215 for height adjustment and surface protection. Alternatively, a UV-curing acrylate adhesive may be employed. As another alternative procedure, IO waveguide chip 215 may be fastened in place using a solvent-free polymeric adhesive, such as a commercially available solvent-free thermal-curing or UV-curing epoxy. This approach may leave less time to reoptimize alignment (due to generally higher pre-cure viscosity because of the absence of a solvent) but may advantageously reduce or eliminate subsequent outgassing of the adhesive (which may shorten device lifetime if not properly mitigated).

Alternatively, IO waveguide chip 215 may be fastened in place using solder. In one implementation of this approach, metal pads may be defined photolithographically on the active surface of IO waveguide chip 21 (on the surface of any thin film coatings deposited over the waveguides, or on the surface of the LN material itself if no such coatings have been applied). It is noted that the metal pads should lie between the waveguide features so as not to introduce excessive absorption losses. Solder may be deposited and patterned onto these contact pads as known in the art to create solder preforms distributed in some pattern on IO waveguide chip 215 matched to respective bonding pads on submount 205. Preferably, the thickness of the solder as deposited is not sufficient to touch the submount bonding pad when IO waveguide chip 215 is contacted to standoff structure 222, but is sufficient to cause the solder, upon melting, to contact the submount bonding pad thereby producing a robust mechanical joint. In the case of this solder attach approach, after initial alignment optimization the assembly may be heated to the melting point of the solder, which preferably is lower than the melting points of any solders used in the attachment or wirebonding of the submount/laser assembly. Once the solder has balled up and made contact between the bonding pads on the respective components the temperature is reduced to re-solidify the solder and form the mechanical bond. Preferably the laser is not energized during thermal cycling during solder bonding, as high temperature operation can lead to premature and sometimes instant failure. Note that techniques known in the art to improve solder bonding, such as the use of fluxes, forming gas and formic acid vapor may be applied to improve this process.

It is noted that a laser welding-based technique may alternatively be utilized to attach IO waveguide chip 215 to submount 205. Since the LN material of waveguide chip 215 is substantially transparent to optical energy having wavelengths in the 0.35 µm-4 µm region, a laser beam having a wavelength within this range is able to traverse the material without significant absorption such that it impinges upon and is absorbed by a solder or adhesive target. In this manner an IR laser welding station could be used to attach IO waveguide chip 215 to submount 205. Because this technique does not require heating of large portions of IO waveguide chip 215 and/or submount 205, its use may be advantageous in connection with component materials having relatively low melting or deformation temperatures.

The assembly comprising submount 205, laser array 210 and IO waveguide chip 215 may now be prepared for the alignment and attach of the fiber array, which functions to carry the laser light to the amplification region. It is noted that the task of coupling the fiber array to the mode matched output waveguides of IO waveguide chip 215 requires considerably less precision, relative to the task of coupling laser array 210 and IO waveguide chip 215, due to the significantly greater mode sizes involved. The mode diameters of the output waveguides and the single mode fibers are typically between 3-7 µm. Preferably, the array of fibers is prepared using silicon V-groove technology as known in the art, such that (1) the centers of the optical fiber cores are accurately positioned at the desired pitch to match the output waveguides from IO waveguide chip 215, and; (2) the fiber core centers are aligned along a substantially straight lateral line to match the output waveguide facets of IO waveguide chip 215. It is also preferable that the end faces of the optical fibers be either anti-reflection coated or cleaved/polished at an angle such that the Fresnel reflection from the input fiber core facet is eliminated, or at least not coupled back into the waveguide in IO waveguide chip 215, from where it may be coupled back into the emitters of diode laser array 210 resulting in power and/or wavelength instability in the laser output.

Active optical alignment and attachment may be performed using any of the methods currently practiced in the art, such as laser welding or UV adhesive bonding. In the case of UV adhesive, the assembly is mounted on a holder and connected to drive circuitry to activate some or all of the diode laser emitters. The light emitted from the diode laser and transmitted through IO waveguide chip 215 exits the output waveguide facets of IO waveguide chip 215.

The silicon V-groove mounted fiber array is mounted on a multi-axis micropositioner, preferably with computer control. The fiber array is brought into proximity with the output facet of IO waveguide chip 215 and at least coarsely aligned with respect to lithographically defined fiducial or alignment marks disposed on IO waveguide chip 215. Light coupled into the fibers of the array is monitored by one or more photodiodes or power meters disposed at the output of the fiber array. Preferably the signal from the monitoring photodiodes is used by the computer control system to adjust the position of the fiber array until maximum optical coupling, and therefore transmitted signal, is achieved.

Epoxy may then be dispensed either around the silicon V-groove fiber holder and/or between the fibers and the end facet of IO waveguide chip as desired. Bonding of the silicon V-groove fiber holder may be achieved by exposing the epoxy to UV light. Preferably the epoxy is chosen to exhibit little shrinkage on cure such that the position of the fiber array is not significantly altered by the curing process. In some instances it may be preferable to have an epoxy free optical path, that is to ensure that no epoxy is located between the output waveguide facets of IO waveguide chip 215 and the input facets of the optical fibers in the array. In such instances the epoxy should be dispensed only in side areas free of waveguide facets. In this embodiment where the fiber array is bonded directly to the output facet of IO waveguide chip 215, it may be preferable to bond a spacer piece of LN material to the top surface of IO waveguide chip 215 at the output end prior to the cut and polish processes described above. In this way, the end faces of IO waveguide chip 215 and the spacer LN piece are cut and polished simultaneously, effectively forming a single surface which spans both above and below the waveguide output facet. In this case, it is preferable that submount 205 does not extend to the output end of the LN chip as the spacer LN piece would interfere with the flip chip bonding process. In other embodiments described below it may be important that submount 205 extends at least up to and sometimes beyond the output facet of the LN chip. The spacer LN piece described above serves to provide a larger mounting surface for the attachment of the fiber array, which in turn leads to a more robust and reliable mechanical joint and improved stability and lifetime of the optical alignment between the two structures.

Figure 21:
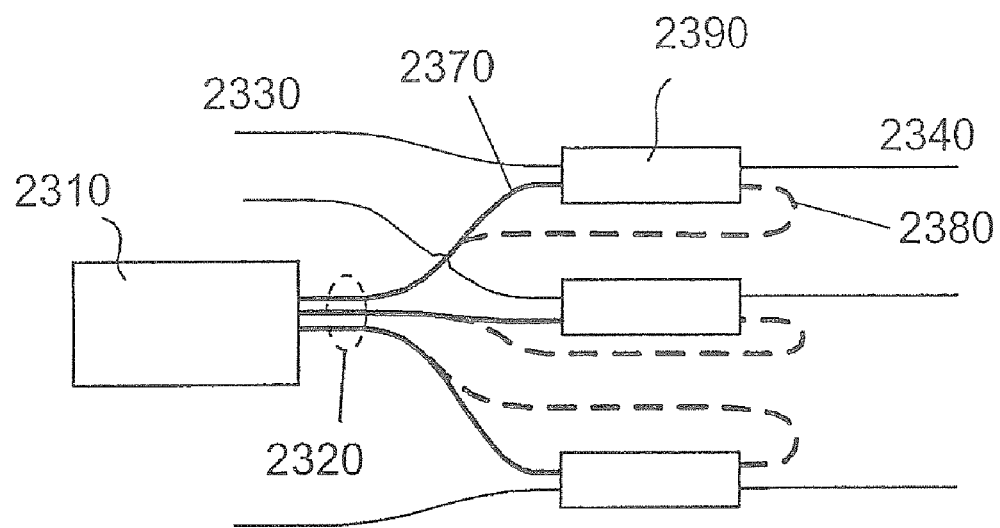
FIG. 21 is a block diagram of multiple EDFAs pumped by a single laser array pump source of the invention.

Once the attachment of the fiber array is performed, the diode laser pump module assembly is completed by the provision of an external protective package such as that shown in FIG. 21, and suitable electrical and control connections are provided to enable the desired laser operation as known in the art. Preferably the diode laser pump source may be enclosed in a hermetically sealed butterfly type package as known in the art.

It should be noted that elements of the external package may be incorporated into the above described process flow at any point without interfering with the performance of this invention. For instance, it may be preferable to place and mount the submount/laser diode array/IO waveguide chip assembly inside the open butterfly package before performing alignment and attach of the fiber array, or vice versa. In addition, it will be apparent that, for example, the output ends of the fibers may be attached to the amplifier(s) by connectorizing or fusion splicing.

Figure 5:
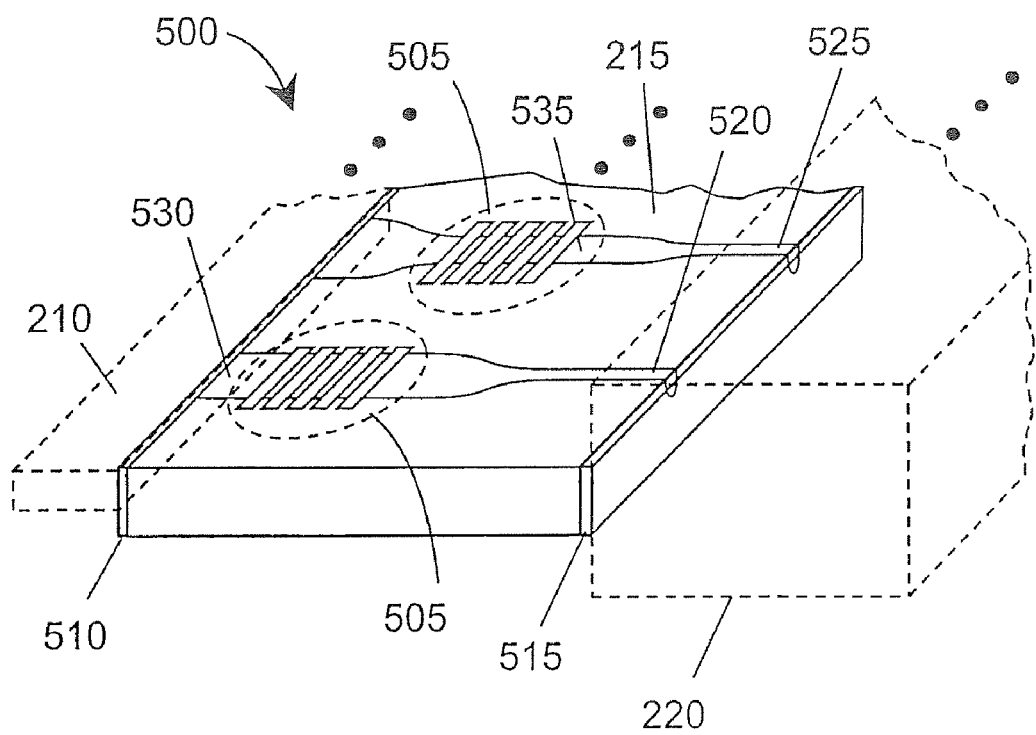
FIG. 5 is a symbolic diagram of a second embodiment of the invention, showing in particular an IO waveguide array chip with distributed Bragg reflector structures (DBRs) for wavelength stabilization and waveguide tapers for mode size conversion.

FIG. 5 depicts an amplifier pump source 500 in accordance with a second embodiment of the present invention, wherein increased functionality is provided to pump source 500 by the inclusion of distributed Bragg reflectors (DBRs) 505 in the form of Bragg gratings. For the purpose of clarity, the submount has been omitted from FIG. 5, and laser array 210 and optical fiber array 220 are depicted in phantom. DBRs 505 are preferably superimposed on the optical waveguide structures 507 of IO waveguide chip 215 and are configured to provide narrow-band, wavelength-selective retroreflection. The light reflected by each DBR 505 is fed back into a corresponding emitter of laser array 210 for the purpose of stabilizing the wavelength of emitted light, in accordance with processes well established in the prior art. The wavelength of light reflected by each DBR 505 is determined by its grating period. It should be noted that the grating period may be varied among the several DBRs 505 fabricated on IO waveguide chip 215, thereby enabling different emitters of laser array 210 to be locked to different wavelengths. With the appropriate choice of DBR bandwidth (determined by the length of the grating), and reflectivity (determined by a combination of the grating order, effective depth, and length), the light output by each emitter can be locked to within the bandwidth of the associated DBR 505 in a manner largely independent of the operating conditions of laser array 210, specifically drive power and ambient temperature. Typically a reflection back into the emitter of a few percent of the total emitter output power is sufficient to lock the emitter output to the wavelength band of DBR 505. The output facet of the laser array 210 may have an appropriate low reflectivity coating, again in the order of a few percent, while the input facet of IO waveguide chip 215 should preferably have a very low reflectivity anti-reflection coating 510 such that the broadband (in wavelength terms) reflectivity from the input facet does not destabilize the emitters of laser array 210. The output facet of IO waveguide chip 215 should also preferably have an anti-reflection coating 515 to suppress reflection.

DBRs 505 may be fabricated using planar lithographic processing methods known in the art. For example, a fine pitch grating suitable for retroreflection of ~980 nm light in a lithium niobate waveguide requires a period of around 230 nm for a first order structure. This period may be created in a thin photoresist layer (~0.1 μm) using two-laser-beam holographic interference lithography or using a contact printing approach with a phase mask illuminated either with a UV laser or a mercury lamp. Development of the exposed resist leaves a grating pattern which may be transferred directly into the lithium niobate, or into some surface layer on the lithium niobate, using an approach such as ion beam milling. Alternatively reactive ion etching or laser ablation could be used for pattern transfer. The depth of the grating and thus the reflectivity per grating line is defined largely by the depth, which is simply controlled by the etch time. Different periods may be fabricated using a sequential exposure and etch process with shadow mask material such as chrome covering the areas which do not require a grating of a particular period. Alternatively, using the phase mask exposure process, a number of different periods can be defined simultaneously using a custom designed and fabricated phase mask containing the relevant patterns for transfer. This grating fabrication processing for IO chips would typically be performed after waveguide fabrication on a wafer but before surface protection coating and chip dice (separation into chips) and end face polish. The exact design of DBRs 505 depends heavily on the precise waveguide structure and overlayer/protection materials used and must be adjusted accordingly based on existing modeling capabilities combined with empirical measurements of DBR 505 performance after fabrication.

In FIG. 5, different locations of DBRs 505 are shown on different waveguides 520, 525. The placements of DBRs 505 illustrates that the design of the DBR and the design of the waveguide are linked. On near waveguide 520, DBR 505 is shown disposed on the highly confining input waveguide section 530 that supports a very small mode to provide good coupling efficiency to the emitter output mode. In this case the grating needs only to be very shallow in order to achieve a desired low reflectivity as a shallow structure interacts strongly with the small, tightly confined optical mode. However, for some waveguide fabrication processes, the tightly confined input waveguide section may exhibit relatively high propagation losses, making it preferable that the input section be as short as possible. In this case it is preferable to place DBR 505 as shown on the far waveguide 525, superimposed on a lower loss, more loosely confining waveguide section 535. Preferably waveguide section 535 is intermediate in mode size and confinement between the tight input section and the loose output section which requires a grating of greater depth in order to interact efficiently with the relatively large and weakly guided optical mode which is dimensioned to match efficiently to a single mode optical fiber.

Alternatively DBR 505 may be the conventional type known in the art formed by lithographically patterned UV exposure of the core and cladding of an optical fiber, and in this case may be located in each of the fibers of output fiber array. In other embodiments, the grating may be superimposed over the taper to increase the bandwidth of the grating, which may be desirable to optimize laser stabilization.

Figure 6:
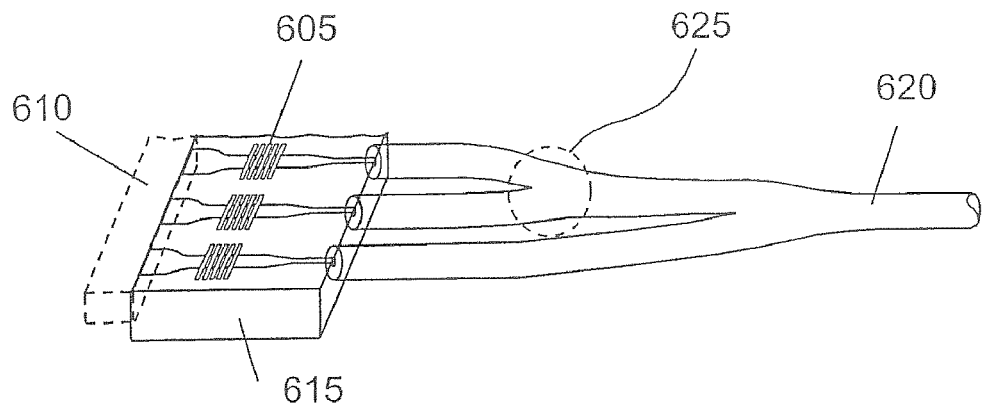
FIG. 6 is a symbolic diagram of fused-fiber-optic directional couplers arranged to combine light output at different wavelengths from several emitters of a laser array.

Another embodiment of the present invention, shown in FIG. 6, adds further functionality to laser array amplifier pump source 600 by increasing the output power coupled into a single fiber 620 by means of wavelength multiplexing the output of several laser emitters from the laser array 610. Increasing the output power in fiber 620 increases the available performance of an amplifier pumped by laser array amplifier pump source 600, while still allowing the individual emitters of laser array 610 to be operated at output powers well below the threshold for failure due to catastrophic facet damage or other effects. Using a set of narrow-band DBRs 605, a number of diode laser emitters are stabilized to different wavelengths, separated by a known wavelength interval and defined by the periods of the DBR 605 gratings. Preferably all the emitted wavelengths lie within the absorption spectrum of the amplifier material of application, such that they may usefully contribute to the amplification of signal light. For application in EDFAs the emitted wavelengths are preferably within about 15 nm of the peak of the absorption spectrum located near 975 nm. The different wavelength outputs from the laser emitters are then combined using fused-fiber-optic directional couplers 625 which provide a wavelength selective coupling function and enable the power in several wavelength channels to be combined to a single fiber 620. The design of fused fiber directional couplers must be matched to the emitter wavelengths and their spacing. Such fused fiber WDM couplers are commercially available with wavelengths separations down to ~2 nm to combine 4 or more channels to a single fiber.

Figure 7:
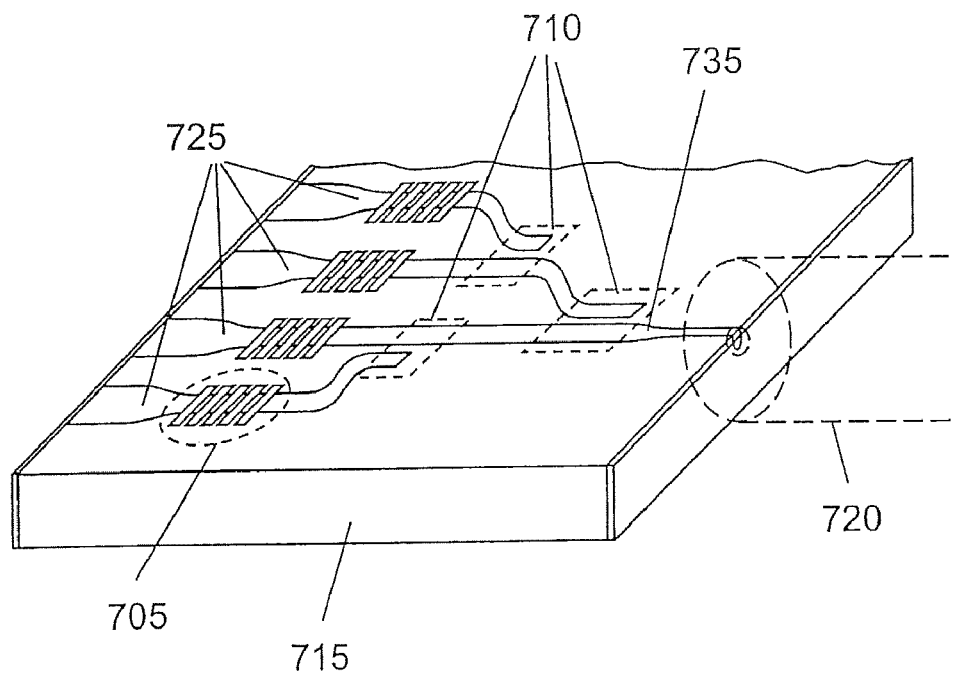
FIG. 7 is a symbolic diagram of waveguide directional couplers formed on the IO waveguide chip and arranged to combine the light output at different wavelengths from several emitters of a laser array.

FIG. 7 illustrates an embodiment of the invention similar to the FIG. 6 embodiment but distinguished therefrom by its use of integrated optic waveguide directional couplers 710 (in place of the fused fiber directional couplers of the FIG. 6 embodiment) to perform the wavelength multiplexing operation on the IO waveguide chip 715. Directional couplers 710 may be fabricated by defining two optical channel waveguides in close proximity to create a coupling region. In LN, waveguide directional couplers 710 may be designed using existing modeling capabilities such as beam propagation modeling (BPM) and knowledge of the properties of annealed proton exchange waveguides. The length of the coupling region of directional couplers 710 is known to be inversely proportional to the wavelength separation of the two channels to be combined. In FIG. 7 the optical waveguides are shown to have two taper regions: a first taper region 725 situated upstream in the optical path relative to directional couplers 710, and a second taper region 735 situated downstream in the optical path relative to the directional couplers 710. This arrangement enables independent optimization of the waveguides in the three main sections of the chip input, directional couplers, and output. In this way the waveguide dimensions and confinement can be optimized to achieve high input coupling efficiency from laser array 705, minimum directional coupler length with low loss within the IO waveguide chip 715, and high output coupling efficiency to single mode optical fiber 720. The number of channels which can be practically multiplexed together in this way is limited by the length of the directional couplers. For example, a simple coupler designed to multiplex two wavelengths around 980 nm separated by ~5 nm may have a length of ~4 mm, 8 mm or 19 mm, for example.

FIGS. 20*a-d* depict still further embodiments of the invention, wherein wavelength selective feedback to stabilize the individual emitters of the laser diode array is provided after, and by, one or more wavelength multiplexing directional couplers that combine the outputs of several emitters of the array, as described in detail below.

Figure 20A:
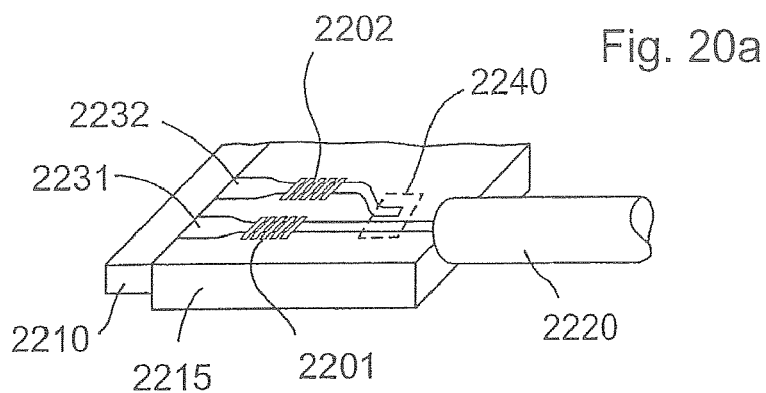
FIG. 20a is a symbolic diagram showing a waveguide directional coupler for wavelength multiplexing, and distributed Bragg reflectors (DBRs) for wavelength stabilization positioned before the directional coupler, arranged on an IO array chip.

The use of narrow-band DBRs for stabilizing diode lasers was described above with reference to FIG. 5. Use of fused fiber couplers and, alternatively, IO waveguide directional couplers, for combining the output of two or more emitters operating at different wavelengths, also called wavelength multiplexing, was described in connection with FIGS. 6 and 7. In those embodiments, the DBRs are positioned upstream in the optical path from the wavelength multiplexing directional couplers as shown in FIG. 20*a*. Referring to FIG. 20*a*, two emitters of a laser diode array chip 2210 are butt-coupled to waveguides in an IO waveguide chip 2215. Two waveguides 2231 and 2232 receive light from the emitters, and are adapted with DBRs 2201 and 2202, followed by a waveguide directional coupler 2240. DBRs 2201 and 2202 stabilize the two emitters at two different wavelengths λ1 and λ2. The outputs at the two wavelengths are combined (multiplexed) in directional coupler 2240 and propagate in a single waveguide 2231 to the output facet of the IO waveguide chip, where the combined light beam containing energy at two different wavelengths couples into an output optical fiber 2220.

Figure 20B:
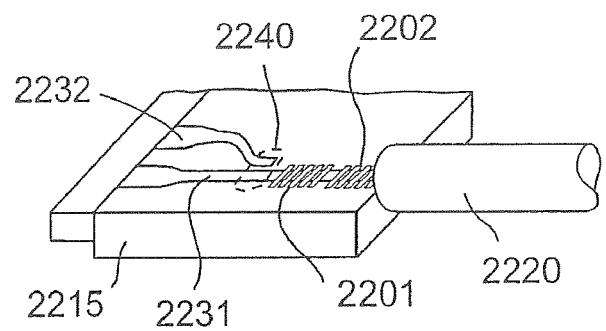
FIG. 20b is a symbolic diagram showing a waveguide directional coupler for wavelength multiplexing, and DBRs for wavelength stabilization positioned in series after the directional coupler, arranged on an IO array chip.
Figure 20C:
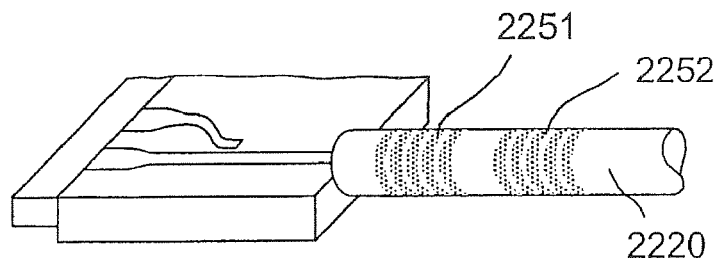
FIG. 20c is a symbolic diagram showing a waveguide directional coupler for wavelength multiplexing, and DBRs for wavelength stabilization positioned in series after the directional coupler, with one DBR on the IO array chip and another DBR on an output fiber.

In the embodiments depicted by FIGS. 20*b-c*, the stabilizing DBRs are positioned after the directional couplers, in series, one after another. In a first alternative shown in FIG. 20*b*, two DBRs 2201 and 2202 are disposed in series on waveguide 2231, after waveguide directional coupler 2240, on IO chip 2215. According to known art, the waveguide directional coupler 2240 transmits, in the reverse direction, light of wavelength λ1 preferentially in one input waveguide arm, such as 2231, and light of wavelength λ2 preferentially in the other input waveguide arm, such as 2232. It should be noted that not all waveguide directional couplers have this property, and therefore this embodiment requires use of appropriate design for waveguide directional couplers to ensure their functioning in the desired manner. In a second alternative, shown in FIG. 20*c*, two stabilizing DBRs 2251 and 2252 constructed in the form of fiber Bragg gratings (FBGs), as known in the art, are positioned in series on output fiber 2220. In a third alternative (not shown) one stabilizing DBR is positioned on waveguide 2231 after directional coupler 2240 on IO waveguide chip 2215, and the other stabilizing DBR is positioned on output fiber 2220 coupled to waveguide 2231.20*d* The DBRs in the alternative positions, two of which are shown in FIGS. 20*b-c*, are effectively in series in the multiplexed light output path and function in substantially the same manner described in connection with FIG. 20*b*, whether they are on the IO chip or on the output fiber. Grating fabrication processes in optical fiber may be a more mature technology than grating fabrication processes in IO materials, and thus may provide an economic advantage in some applications. Positioning the DBRs on optical fiber rather than on the IO chip allows wavelength selection of the emitters of a laser diode array independently of wavelength multiplexer design, and this may also provide an advantage in some cases.

Figure 20D:
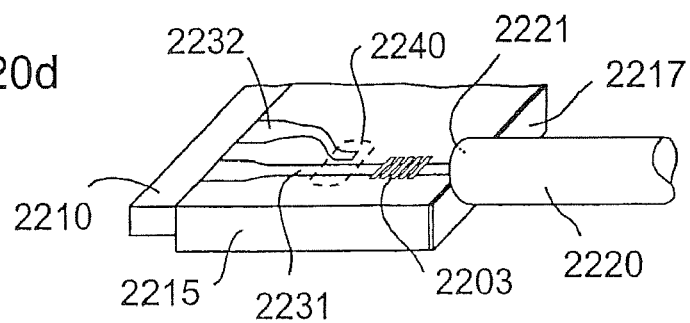
FIG. 20d is a symbolic diagram showing a waveguide directional coupler for wavelength multiplexing, and DBRs for wavelength stabilization positioned in series on the output fiber.

In a fourth alternative form of this embodiment shown in FIG. 20*d*, feedback for stabilizing the laser diode array emitters in a wavelength multiplexed configuration is provided after the waveguide directional couplers, in a position substantially similar to those shown in FIGS. 20*b-c* for narrow-band DBRs, by a weak spectrally-wide reflector.

Preferably, such a reflector is a wideband DBR 2203 disposed on the optical waveguide 2231, between the directional coupler 2240 and the output facet 2217 of the IO waveguide chip 2215, and reflections originating from further downstream in the optical path are suppressed by appropriate techniques known in the art, such as by adapting the end of the optical fiber 2220 with a lens or chisel-tip shape and providing anti-reflective (AR) coating thereon. Wavelength selectivity to stabilize the emitters to particular wavelengths is provided by the waveguide directional coupler 2240 acting together with the wideband reflector. Maximum feedback occurs at the wavelengths of preferential reverse transmission in the waveguide directional coupler, which is appropriately designed with sufficient wavelength selectivity, according to known art. Preferential reverse transmission to one input waveguide 2231 of the directional coupler occurs in narrow bands peaked at a first set of wavelengths $\lambda 1, \lambda 3, \ldots$, and to the other input waveguide 2232, at a second set of wavelengths $\lambda 2, \lambda 4, \ldots$, which alternate with the first set of wavelengths such that $\lambda 2$ is intermediate $\lambda 1$ and $\lambda 3$, $\lambda 3$ is intermediate $\lambda 2$ and $\lambda 4$, and so on. The optical reflection band of DBR 2203 is adapted to lie within the open-loop optical gain band of the laser diode array emitters, and to be sufficiently wide to reflect two adjacent preferential reverse transmission wavelengths (e.g., $\lambda 1$ and $\lambda 2$), one for each of the two input waveguides of the directional coupler 2240, but to substantially transmit and not reflect the other wavelengths of both sets. Therefore the emitters of the laser diode array 2210 that are coupled to these waveguides are stabilized at the wavelengths $\lambda 1$ and $\lambda 2$, respectively. Alternatively, the wideband DBR 2203 may be omitted, and wideband reflection may be provided by a thin film stack optical reflector, with its reflection band and operation substantially similar to that described above for DBR 2203, disposed on the output facet 2217 of IO waveguide chip 2215 (in place of an AR coating). Further alternatively, the wideband DBR or thin film stack reflector may be omitted and wide band reflection may be provided by an uncoated or suitably coated output facet of the IO waveguide chip or the input facet of a cleaved output fiber, and wide-band selectivity provided by adapting the laser diode emitters of array 2210 to have an open-loop optical gain spectrum that is appropriately wide to contain only the wavelengths $\lambda 1$ and $\lambda 2$, thereby selecting only these directional coupler retroreflection wavelengths for lasing, one for each emitter. This structure and method to employ the narrow-band wavelength selectivity of optical waveguide directional couplers to stabilize the laser emitters is not known in prior art, and provides the considerable advantage of removing the need to have narrow-band DBRs and to match their spectral transmission characteristics to the wavelength multiplexing directional couplers.

Figure 8:
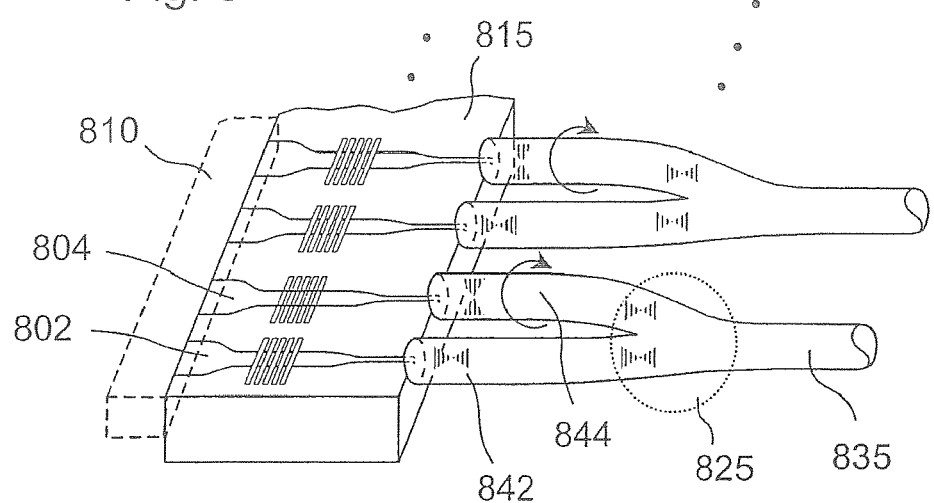
FIG. 8 is a symbolic diagram of optical fiber polarization multiplexers arranged to combine the light output from pairs of emitters of a laser array.

FIG. 8 shows a still further embodiment of the present invention which provides for increasing the output power of the laser array amplifier pump source that is coupled into a single fiber output. As depicted, fiber optic polarization-maintaining (PM) combiners or multiplexers 825 are used to combine the outputs from pairs of adjacent waveguides 802 and 804 of the IO waveguide chip 815 into single output fibers 835. Here the output of waveguides 802 and 804 on IO chip 815 are coupled into polarization preserving optical fibers, the output from waveguide 802 coupling into optical fiber 842 and the output from waveguide 804 coupling into fiber 844. Alternate fibers have been twisted by 90° so that the outputs from adjacent waveguides couple into orthogonal polarizations in alternate fibers, as indicated symbolically by alternating butterfly shading at the ends of the fibers. In general, all of the outputs from a laser array 810 and IO waveguide chip 815 are polarized in the same direction, parallel to the plane of the diode junction. Owing to the twist as indicated by circular arrows in FIG. 8, the polarization of the light becomes physically rotated 90° along with the fiber in alternate fibers, such as fiber 844, before joining polarization multiplexer 825. The physical 90° rotation or twist of alternate fibers may be readily accomplished by alignment when the polarization preserving fibers are fabricated into an array using a silicon V-groove holder. Thus the outputs of two adjacent waveguides may be combined onto the same output fiber but in orthogonal polarizations to effectively increase, by almost a factor of two, the output power in the single fiber, with the penalty of only a small loss associated with the polarization multiplexer itself. Polarization multiplexers capable of combining orthogonally polarized light around 980 nm are known in the art and are commercial available.

It is noted that the application of the polarization multiplexer may be independent of, or combined with, the wavelength multiplexing of the FIG. 6 embodiment described above in order to further increase the power coupled into an output fiber. It is further noted that the functions of polarization rotation and combination/multiplexing can be performed on the integrated optics chip itself. In LN, it is known to be possible to fabricate frequency selective polarization rotators or TE-TM converters, as well as broadband polarization combiners. From these basic building blocks it is possible to construct a multiple stage polarization combiner. In such a device it is necessary to fabricate a waveguide structure that supports both TE and TM polarization modes, whereas the commonly employed annealed proton exchange(APE) process supports only extraordinarily polarized modes (TE in X and Y-cut LN, TM in Z-cut LN). Other waveguide fabrication techniques in LN include metal indiffusion, which generally creates a polarization insensitive waveguide (although in some instances, such as titanium indiffusion, it often creates waveguides that are susceptible to photorefractive damage and have low power handling capability). A suitable fabrication process to achieve the integrated polarization multiplexer may be zinc indiffusion, which has been shown to produce low loss, polarization-insensitive and photorefractively robust optical waveguides. A transition region from the input, tightly confined annealed proton exchange waveguide is required to match the input light to the relatively larger mode dimensions of the waveguide formed by zinc-indiffusion, which then matches well to the single mode optical fiber output. Alternatively, waveguides formed by titanium indiffusion may be employed, but may be subject to the operational problems alluded to above.

It is further noted that multiplexed laser array pump sources are preferably designed such that the specified maximum optical output power in each output fiber may be achieved at less than the maximum possible drive current applied to each laser emitter. Thus, should one or more individual laser emitters fail or suffer from reduced power output in any of the emitter-multiplexed embodiments described above, the remaining fully operational emitter(s) may be driven to produce higher output in order to compensate and maintain the overall design output power without over-driving individual elements, which otherwise would significantly increase the chances of further emitter failures due to junction or facet damage.

Figure 9:
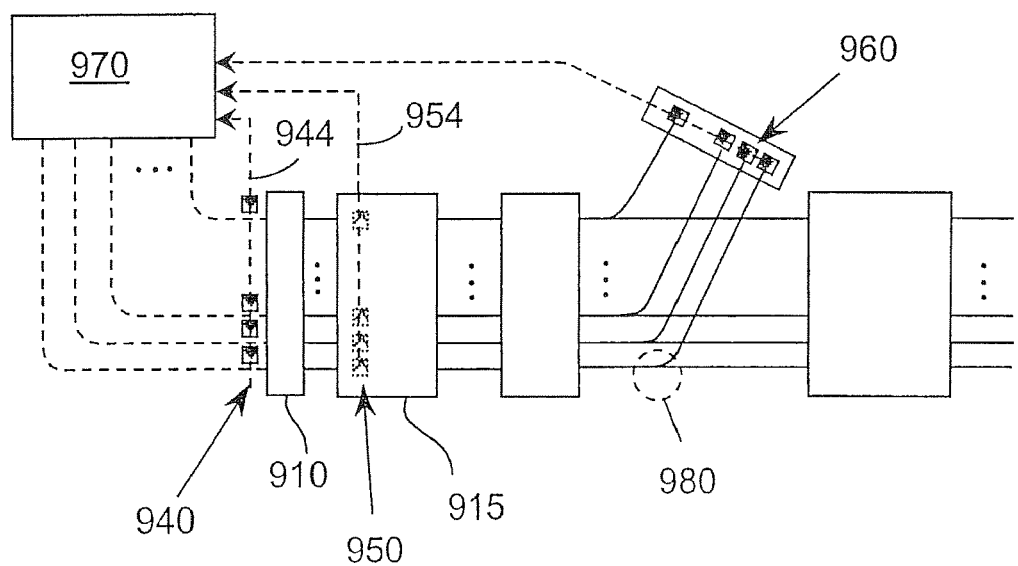
FIG. 9 is a block diagram illustrating detector array locations for output monitoring and power stabilization.

FIG. 9 depicts another embodiment of the present invention, which adds detectors to monitor the output power of the laser emitters, allowing control of the pump source output in response to control signals. FIG. 9 illustrates several possible alternative locations for the detectors, which preferably take the form of photodiodes sensitive at the emission wavelength of the laser array, e.g., silicon photodiodes which are sensitive at around 980 nm. Detectors in location 940 preferably represent an array of silicon photodiodes, disposed near the back facet of the emitters of laser array 910, and aligned to receive radiation emitted from the back facet on a one-to one basis, wherein each emitter is uniquely associated with one photodiode. The detector array may be monolithic or it may comprise individual photodiode chips. The photodiodes may be attached to the submount either prior or subsequent to the laser array, provided that appropriate care is taken to select processes that do not interfere with those described above for the mounting of diode laser array 910 and IO waveguide chip 915. If required, the submount may incorporate features such as turning mirrors located adjacent to the back facet of laser array 910 to redirect the light emitted from the back facet perpendicular to the plane of the major surface of the submount. In this case the photodiode array may be mounted over the turning mirrors (either face down or in a back-lit configuration) to receive the light emitted from the back facet, and secured in place without contact with any electrical interconnection traces disposed on the submount surface for activation of the laser array 910 emitters. Electrical contact to the photodiode array may be made by solder joints or wire bonding or conductive epoxy. The output signals from the photodiode array are preferably transferred to electrical connection traces on the submount surface and from there may be wirebonded to output pins in the external package for connection to the control electronics and laser drivers 970, as indicated symbolically by the dashed line 944. Alternatively, the output signal may be directly wirebonded to traces in the external package. The actual optical output power in each channel may be calibrated with respect to the photodiode signal using a power meter to measure the output power in each output fiber, and the calibration constants stored in memory within the driver circuitry.

Figure 10:
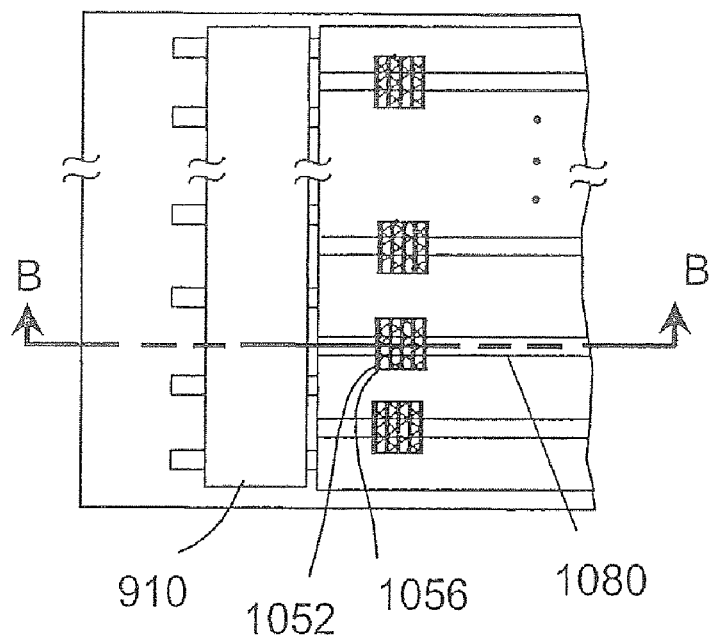
FIG. 10 is a symbolic diagram, show in plan view, of an integrated power monitoring detector array on an IO waveguide array chip.
Figure 11:
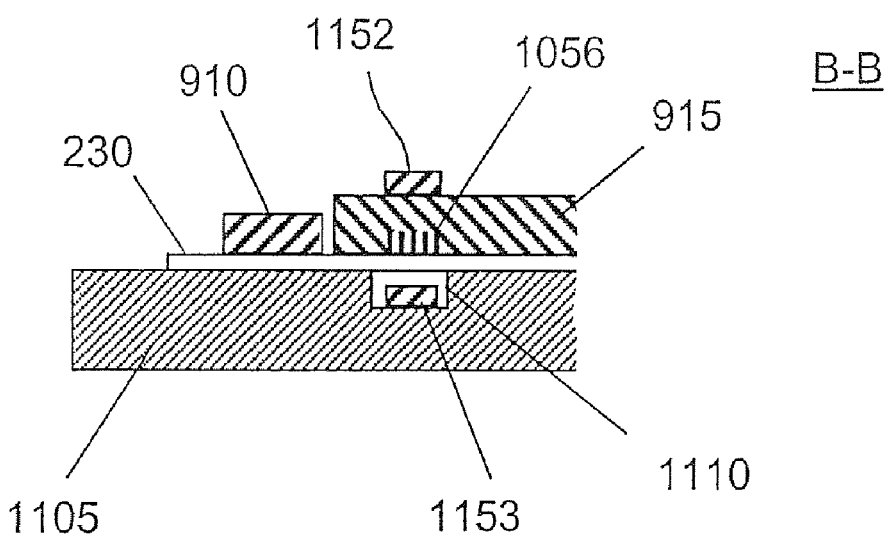
FIG. 11 is a cross-sectional view taken along line A-A of FIG. 10 showing locations of distributed Bragg reflector and optical detector chip (two alternatives) for power monitoring.

The detectors may alternatively be disposed at location 950. Detectors in location 950 preferably represent an arrangement whereby the optical power in each output channel of the pump source is monitored via a structure incorporated into IO chip 915. FIGS. 10 and 11 show an embodiment of an integrated power monitoring array incorporated into the present invention. In this embodiment the power in each channel is monitored by a photodiode 1052 disposed to receive light scattered out of optical waveguide 1080 by a distributed Bragg reflection (feedback) grating 1056. Alternatively, a waveguide discontinuity, pit or other suitable scattering structure which extends into the evanescent tail of the waveguide mode may be substituted for grating 1056. Some scattering is inherent in the practical implementation of a surface etched relief grating (as described in an embodiment above), even for a first order grating. The proportion of the input beam that is scattered out from waveguide 1080 is dependent on the mode intensity profile that interacts with the grating features. As the mode intensity profile does not change with power, the scattering proportion should be constant, independent of input power. Thus a measure of the scattered light may be used as an indicator of the power incident (and transmitted through) the grating. Alternatively, the grating structure may be designed specifically to provide an out of plane diffracted beam, for instance as a second or third order grating, as is known in the art.

The photodiodes, which may be discrete devices or a monolithic array, are disposed to receive the light scattered or diffracted from the waveguide by the grating. They may for instance be bonded face down to the backside of the integrated optic chip at 1152, located substantially over the grating regions on the front face, as shown symbolically in FIG. 11. Alternatively the photodiodes may be located at 1153, recessed at least partially in wells 1110 in the submount 1105. These wells may be fabricated by lithographic patterning and etching during the submount fabrication process. The detectors (or detector array) may be mounted into the well using solder or conductive epoxy and may be either front illuminated or back lit. Alternatively the photodiodes may be mounted directly to the front face of the integrated optics chip. The electrical signals from the photodiodes may be carried by conductive traces defined over the surface of the submount to transfer the signals to the edge of the submount for connection to output pins in the external package, and from there to the control electronics and laser drivers 970 identified in FIG. 9 as indicated symbolically by 954. The mechanical and electrical attach processes must of course be compatible with the processing outlined earlier for the laser array and integrated optic chip attach.

Figure 12:
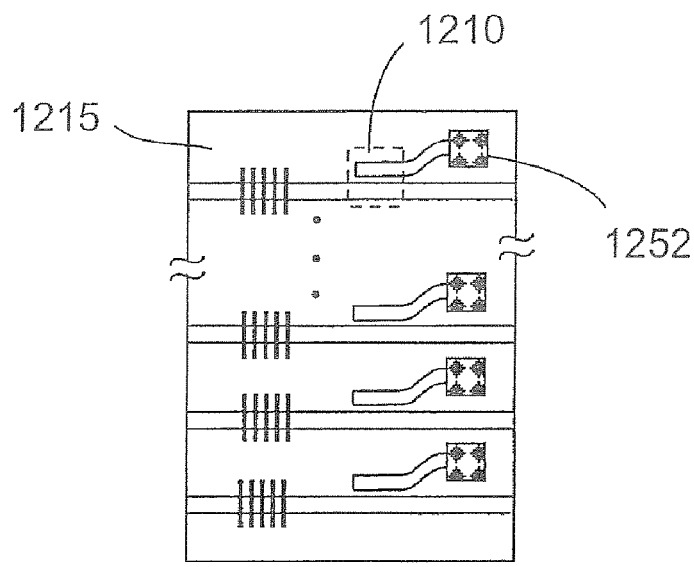
FIG. 12 is a symbolic diagram, shown in plan view, of an integrated power monitoring detector array using waveguide directional couplers.

FIG. 12 illustrates an alternate embodiment of an integrated power monitoring array with photodiode power monitoring detectors 1252 located at the outputs in integrated optic directional coupler taps 1210. The directional coupler taps are preferably designed to couple only a small proportion (preferably around 2-4%) of the power out of the primary waveguides. Couplers taps 1210 for this purpose may be designed in a similar manner to those described above for wavelength multiplexing of the laser emitter outputs. If desired, a scattering site or out-of-plane reflector may be fabricated at the end of the directional coupler, e.g. by laser ablation, to more efficiently deflect the light into the photodiode, which may be located on or near either the back or front surface of integrated optics chip 1215. As described above with reference to FIG. 11, the photodiodes (or monolithic array of photodiodes) may be located at least partially within wells in the submount, under the front surface of the IO waveguide chip.

Detectors in location 960 in FIG. 9 may represent a number of photodiodes illuminated by light from an array of fiber-optic taps 980, each coupling a small percentage (typically 2-4%) of the light from a respective one of the fibers in the output fiber array. Such taps are commercially available and widely used for monitoring of fiber optic signals as their coupling ratio (or proportion of power removed from the main fiber) is constant with wavelength and power, and is largely undisturbed by fluctuations in environmental conditions. The fiber taps may be located inside or outside the overall package of the laser array amplifier pump source and may be butt coupled directly to monitor photodiodes either individually or as an array.

Figure 13:
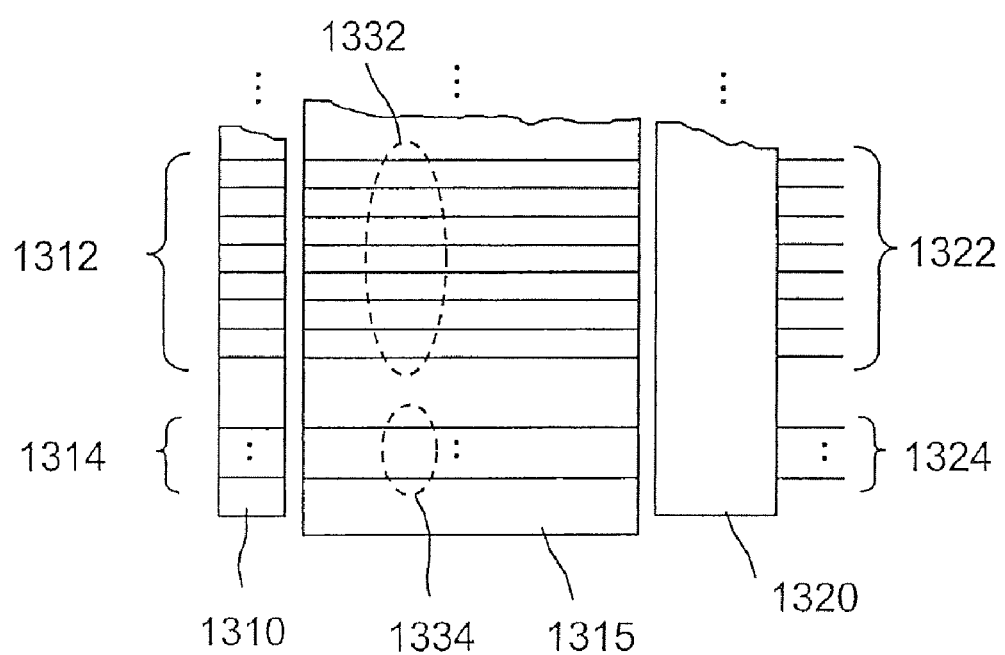
FIG. 13 is a symbolic diagram showing a redundancy-providing array design in plan view.

FIG. 13 depicts another embodiment, wherein further functionality is added to the laser array pump source in the form of redundancy to provide protection against failure of individual laser emitters. In this embodiment supernumerary (extra) laser emitters 1314 are fabricated in the laser array 1310. For example, if the laser array pump source is designed to have 8 output fibers 1322 accepting light from 8 regular laser emitters 1312, an extra 2-4 laser emitters may be provided in the array. These extra emitters are coupled to extra waveguides 1334 in IO chip 1315 simultaneously with the regular emitters 1312 as described above. The extra waveguides in the IO waveguide chip may be provided with all the functionality of the regular waveguides 1332, e.g. DBR, monitor photodiode, integrated optic directional coupler tap, etc. From the output of the IO waveguide chip the extra waveguides are coupled into extra fibers 1324 located in the output optical fiber array simultaneously with the regular output waveguides and fibers as described above.

In operation of the laser array pump source, the regular laser emitters are energized to provide optical output power in the regular output fibers for transmission to the amplifier region. Should one of the regular laser emitters fail, for instance due to defect induced failure of the laser diode junction or catastrophic optical damage at the output facet, one of the extra emitters may be energized and the extra output fiber coupled to the now energized extra emitter connected to the amplifier region in place of the output fiber coupled to the failed laser emitter. The act of connection of the extra output fiber to the amplifier region may take the form of a fiber fusion splice or the use of fiber optic connectors as known in the art. Note that preferably the diode laser emitters in the laser array are separated by sufficient lateral distance such that a defect occurring in one emitter junction or on the output facet of one emitter does not substantially affect the operation of adjacent emitters.

Figure 14:
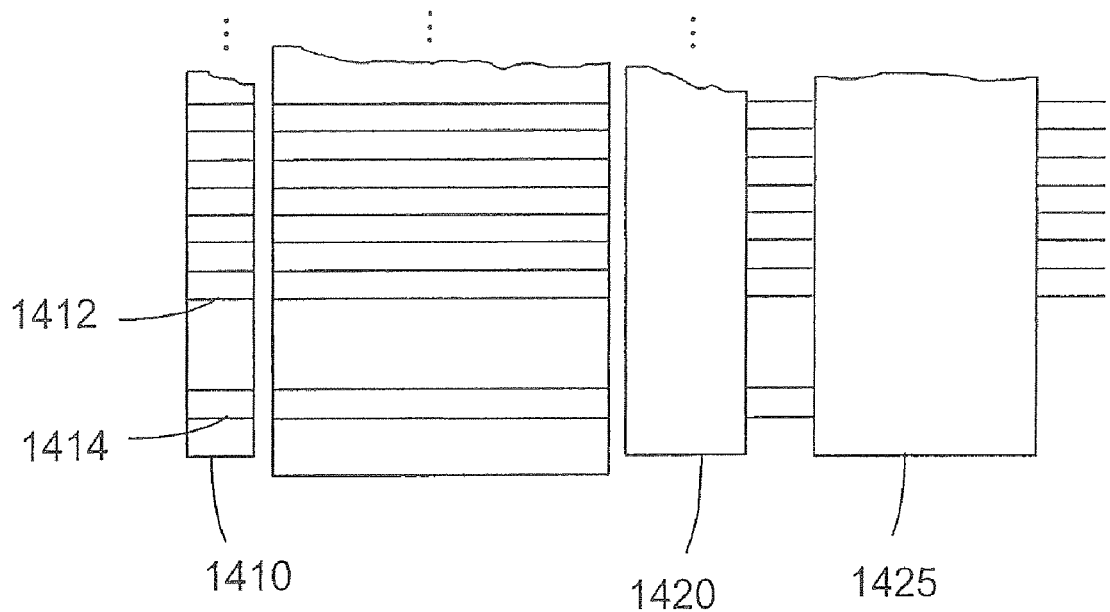
FIG. 14 is a symbolic diagram, shown in plan view, of an embodiment providing for redundancy using an optical fiber switch matrix.

FIG. 14 illustrates a further improvement to the present invention providing the addition of a switch network or fabric 1425 in the output fiber array 1420 to provide redundancy. This switch network enables dynamic and remote reconfiguration of the output from the laser array emitters into the fibers in the output fiber array in response to control signals. Thus, should a regular emitter 1412 on the laser diode array 1410 fail during operation of the laser array pump source, the output from one of the extra emitters 1414 may be switched into the appropriate output fiber for transmission to the amplifier region. The act of switching may preferably be accomplished using a control signal to activate a desired switch from a remote location, allowing computer control of the laser pump source. Such switching control may make use of output channel power monitors to determine whether a particular laser emitter is operating and providing power to a particular amplifier region, and the switching control signals may be provided directly by the laser array pump source drive and control electronics. The switching network may be composed of components known in the art such as thermo-optic switches, opto-mechanical fiber switches or micro-electro-mechanical (MEMs) switches. Redundancy structures and techniques may also be employed during the manufacturing process to deselect or reroute inoperative or poorly performing channels and thereby increase device yields. See U.S. Pat. No. 6,049,641, incorporated by reference herein.

Figure 15:
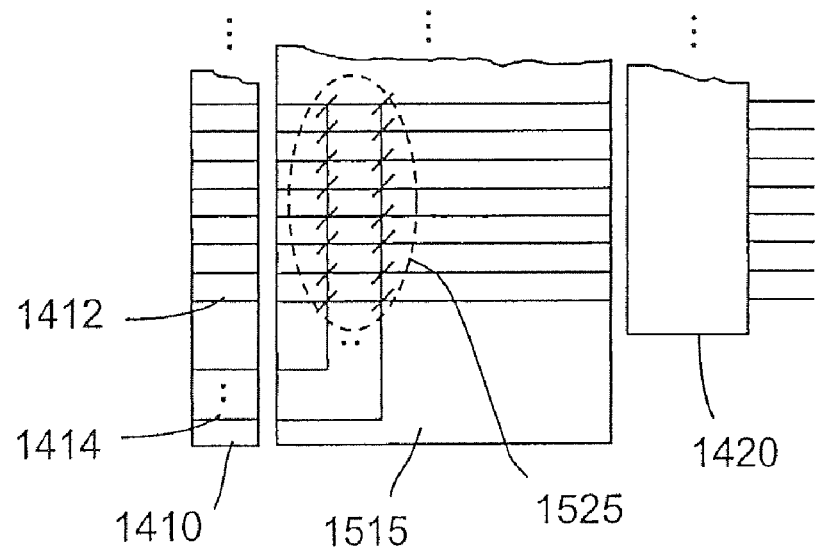
FIG. 15 is a symbolic diagram, shown in plan view, of an embodiment providing for redundancy using a waveguide switch matrix on an IO waveguide array chip.

FIG. 15 shows an alternate embodiment of the present invention where an optical switch fabric or network 1525 is integrated into a waveguide network on an integrated optic chip 1515. The integrated switch network in the integrated optic chip may be comprised of thermo-optic or electro-optic switches as known in the art, such as total internal reflection switches or switched directional couplers, which respond to a control signal in order to switch light between predetermined paths.

Figure 16:
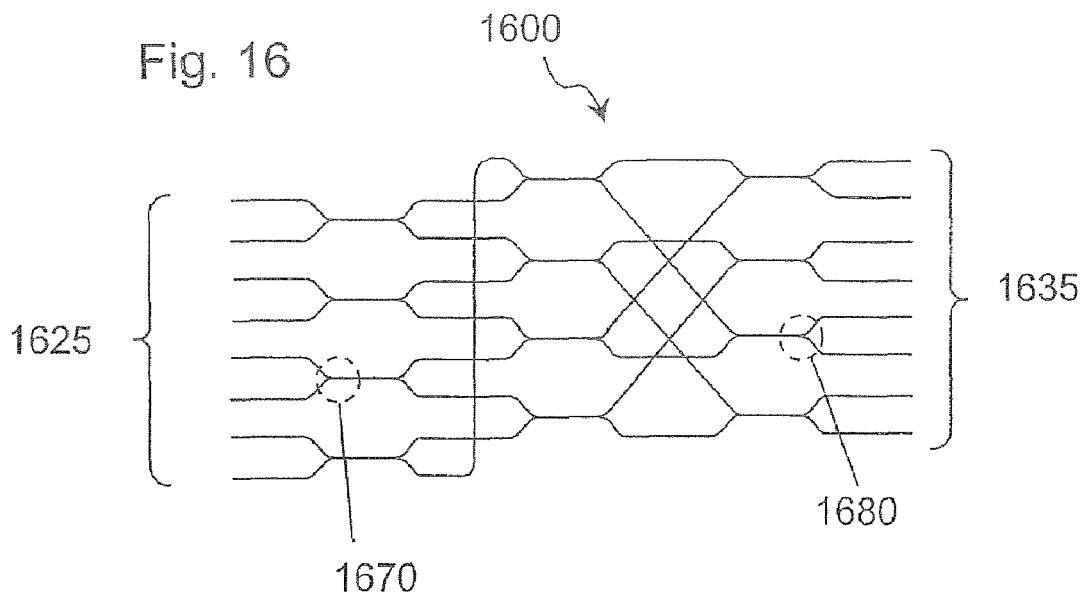
FIG. 16 is a schematic diagram of a passive network of optical fiber couplers and splitters for power sharing among the optical fiber outputs of an array source.

FIG. 16 shows an alternate embodiment where protection against laser emitter failure is provided by a passive network 1600 coupled to the output fiber array 220 identified in FIG. 2. The passive network 1600 preferably comprises a series of 50-50 directional couplers 1670 and power splitters 1680 which share the power entering the input fibers 1625 of the network, among the fibers in the output fiber array 1635. The passive power splitter and coupler network is preferably composed of fused fiber type components that offer efficient power splitting with very little excess loss which would otherwise decrease the available output power from the pump source.

With the incorporation of the passive network, the laser array pump source output becomes substantially tolerant of the failure of individual emitters. The failure of a single emitter simply decreases the power in each output fiber 1635 by a small amount as a consequence of the power sharing provided by the passive network, rather than resulting in a total loss of power in a single output fiber which results from a single emitter failure in the absence of either the passive network or another redundancy arrangement.

Note that in all of these redundancy and failure protection embodiments the phrases "extra emitters", "extra waveguides" and "extra fibers" may refer to single elements, or if desired, sets of elements, such as the wavelength multiplexed elements of the embodiment described above. Thus if one emitter from the wavelength multiplexed set of emitters should fail, a complete new set of emitters may if desired, be energized and switched to the appropriate output fiber.

Figure 17:
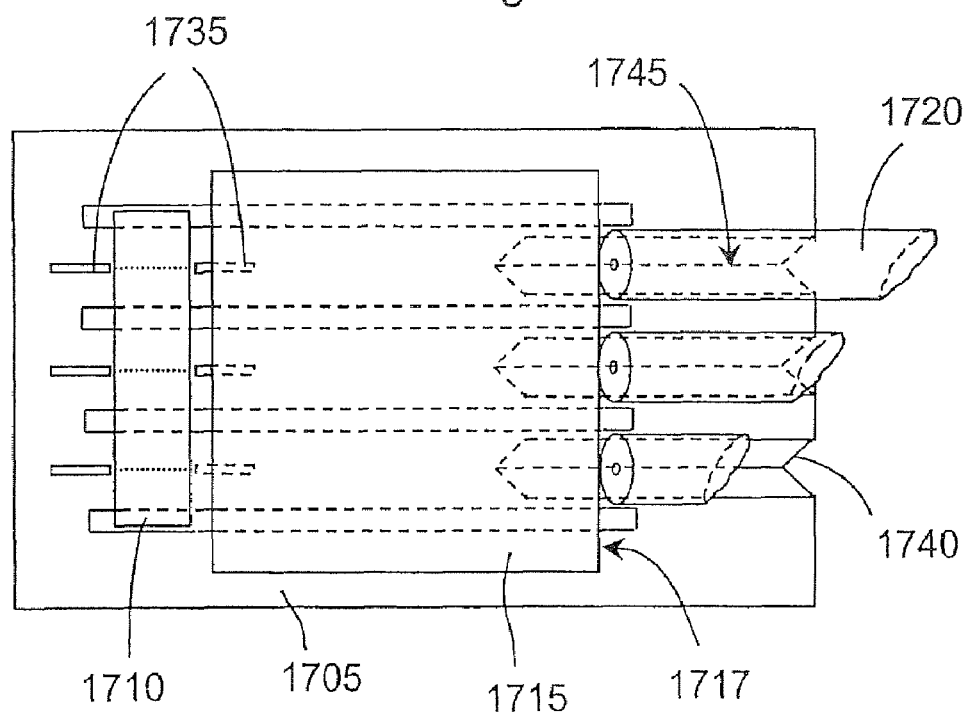
FIG. 17 is a symbolic diagram, shown in plan view, of an optical fiber array disposed in v-grooves on a submount.

FIG. 17 shows yet another embodiment of a pump source 1700 according to the present invention, which provides for a different approach to the attachment of the output fiber array. A submount 1705 carrying a laser array 1710 and an IO waveguide array chip 1715 is preferably fabricated from single crystal silicon. Towards the output end of the submount are fabricated v-grooves 1740 as known in the art for alignment of optical fibers 1720. Such v-grooves are fabricated using photolithographic exposure and patterning of a suitable mask material disposed on the surface of the silicon submount wafer, e.g. silicon dioxide, followed by wet etching of the single crystal silicon. The orientation of the silicon wafer is selected appropriately, for example 100/110. The etching is typically performed using potassium hydroxide (KOH), which provides a selective etching capability such that the wet etching process produces v-grooves 1740. The width of v-groove 1740 at the surface of the wafer is very accurately defined by the width of the lithographically patterned mask. Consequently the position of an optical fiber resting in v-groove 1740 is accurately defined in both the lateral and vertical dimensions via the lithographic patterning process combined with the selective or preferential etching performance of the single crystal material. Preferably the width of v-groove 1740 is defined such that the center of the core of optical fiber 1720 is positioned substantially at the same vertical position above the aforementioned reference surface as the optical waveguide output facet of the IO waveguide array chip 1715.

The alignment and attachment process of the laser array pump source is modified from that described above as follows. During the attachment of the laser array, laser array chip 1710 is accurately aligned relative to alignment marks 1735 defined on the surface of the submount, which are themselves accurately located with respect to the etched v-grooves. The alignment of laser array chip 1710 are performed accurately in the lateral and yaw angle dimensions such that the multiple laser emitters are substantially centered on the axis 1745 of respective v-grooves 1740. The longitudinal alignment may be less precise as the length of IO chip 1715 and the longitudinal extent of v-grooves 1740 are preferably chosen such that there is some overlap of the v-groove 1740 and IO chip 1715 at the output end 1717 of IO chip 1715.

In the preparation of IO chip 1715 it is important to ensure that the end faces of the chip are polished accurately perpendicular to the axes of waveguides in the lateral dimension. IO chip 1715 is aligned to the diode laser and attached to the submount substantially as described above. The yaw angle alignment is particularly important to ensure that the output waveguides of IO chip 1715 are substantially centered over the axes of respective v-grooves 1740.

The output optical fibers may then be aligned and attached using v-grooves 1740 fabricated in the output end of the submount. Several possible techniques exist for aligning fibers 1720. Each fiber 1720 may be individually prepared either with a perpendicularly cleaved and anti-reflection coated end face or with a 4 or 8 degree angle cleave or polish to suppress back reflections. The individual fibers 1720 may then be placed in respective v-grooves 1740 and adjusted for optimum longitudinal position by monitoring the light coupled into the fiber from the activated laser emitter(s) using a photodiode or power meter. The fibers may then be mechanically attached to the submount using, for instance, solder or UV or thermally cured epoxy. Alternatively, the fibers may be pre-fabricated into an array and aligned and assembled to the submount in a single process step.

The use of the above described v-grooves 1740 integrated into submount 1705 for alignment of optical fibers 1720 is complicated by the precise lateral and angular positioning accuracy required during the mounting of the first component (laser array 1710) to submount 1705 to ensure that the laser emitters are substantially aligned to the centers of respective v-grooves 1720. In addition, the length of IO chip 1715 is potentially limited by the thermal expansion coefficient mismatch between the submount and IO chip materials. If the expansion mismatch is sufficiently great and IO chip 1715 sufficiently long, the differential expansion generated during operation of pump source 1700 may be severe enough to fracture the mechanical bonds between submount 1705 and IO chip 1715.

Figure 18A:
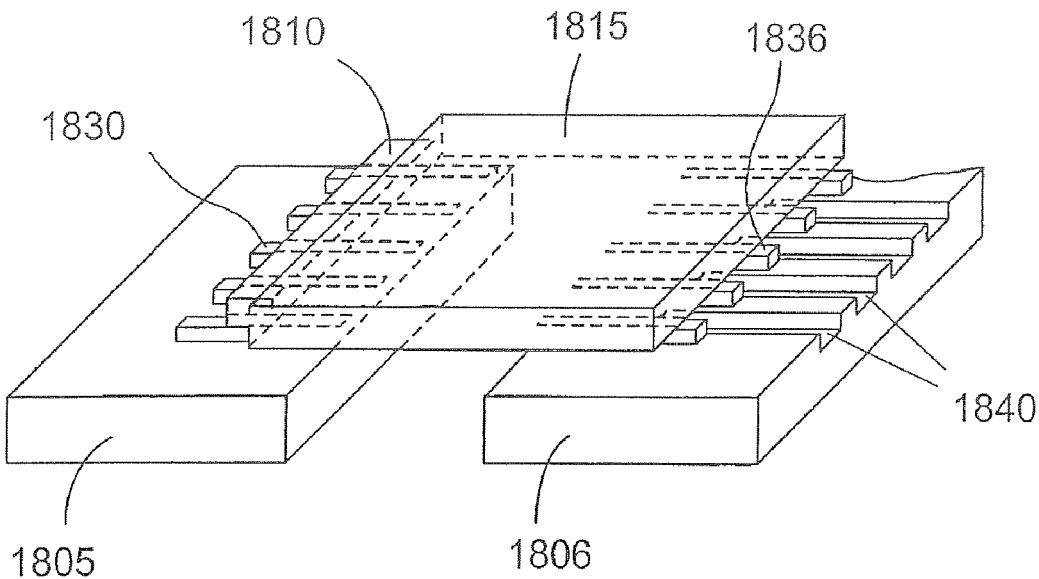
FIG. 18a is a symbolic diagram of a laser array pump source using two submounts with a standoff structure.
Figure 18B:
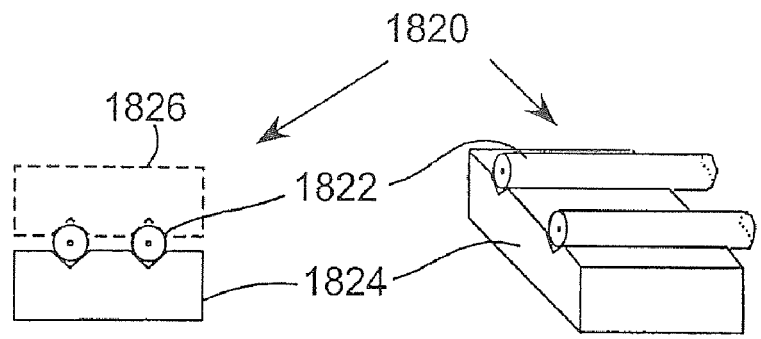
FIG. 18b is a symbolic diagram, shown in elevated end and perspective views, of an optical fiber array assembled on a silicon substrate adapted with v-grooves.
Figure 18C:
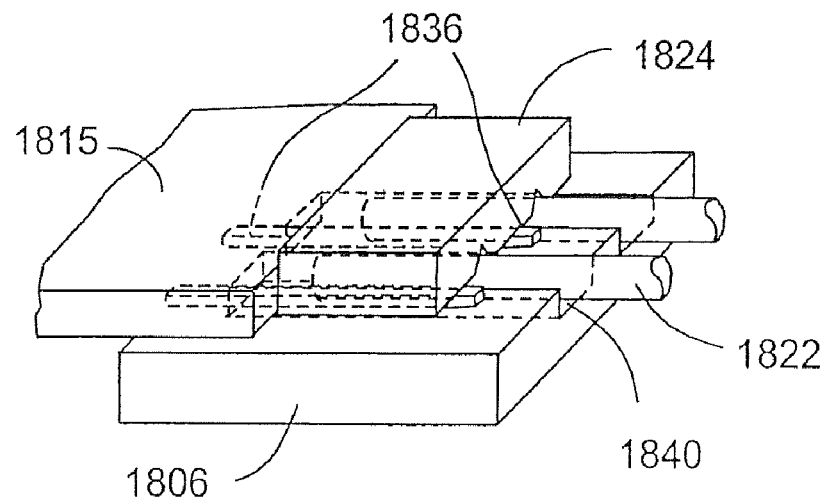
FIG. 18c is a symbolic diagram of an IO waveguide array chip coupled to a v-groove optical fiber array, on a submount with a standoff structure and relief slots.

FIGS. 18*a-c* show another embodiment of a pump source 1800 according to the present invention. This embodiment avoids the differential expansion problems noted above in connection with the FIG. 17 embodiment and enables packaging of relatively long IO chips having a thermal expansion coefficient which differs from that of the submount. A laser array 1810 and IO waveguide chip 1815 are aligned and attached using a reference surface defined by the array of standoffs 1830 on a first submount 1805. As shown in FIGS. 18*a* and 18*b*, a second and separate submount 1806 is used at the output end of IO waveguide chip 1815 to facilitate alignment and attachment of an output optical fiber array 1820. The second submount 1806 is aligned to IO waveguide chip 1815 using lithographically defined alignment and/or fiducial marks. Second submount 1806 may be attached using substantially the same techniques as described previously for attaching the IO waveguide chip to the laser array/submount sub-assembly. Second submount 1806 is provided with a standoff structure which may comprise a second array of standoff features 1836 defining a second reference surface to which IO waveguide chip 1815 is contacted and attached. The second submount is also preferably adapted with a set of relief slots 1840, the centers of which are substantially aligned laterally with the centers of respective output waveguides in IO waveguide chip 1815 after the attachment process is complete. Relief slots 1840, which may for example be fabricated in single crystal silicon using wet etching or deep RIE processing, are preferably large enough to accept a standard single mode optical fiber cladding without contact with the side walls or bottom of the slot. Relief slots 1840 are preferably defined such that they extend under the output end of IO waveguide chip 1815, as shown in FIG. 18*a*.

The output fiber array 1820 is preferably fabricated using a single piece of v-groove silicon 1824, as shown in FIG. 18*b*. Such an assembly may for instance be fabricated by bonding the fibers 1822 into single v-groove piece 1824, followed by the temporary attachment of a second piece of v-groove silicon 1826 (indicated in phantom) to provide a "sandwich" around the fibers to support them during a standard optical polishing process, as known in the art. After completion of polishing, which may be perpendicular or at some predefined angle to the optical axis of fibers 1822, anti-reflection coatings may be applied if desired and the temporarily attached second piece of v-groove silicon 1826 removed to leave the structure of FIG. 18*b*. Preferably the v-grooves are fabricated such that their lithographically defined width places the fiber core the same vertical distance from the surface of the silicon v-groove wafer as the IO waveguide chip optical waveguide is located beneath the surface of the IO waveguide chip.

The fiber assembly may then be mounted on a computer controlled stage as described earlier and positioned such that the fibers 1822 face the relief slots 1840 fabricated in second submount 1806. The v-groove silicon is then brought down into contact with the second reference surface defined by second array of standoff features 1836 on second submount 1806. Using the techniques described earlier, substantially uniform contact between the silicon v-groove material and the reference surface is achieved, substantially aligning the axes IO waveguide and the optical fiber in the vertical dimension. After optimization of the longitudinal and lateral positions of the fiber array relative to IO waveguide chip 1815, the two components may be mechanically attached, for example, using UV cured epoxy or solder to produce the assembly shown in FIG. 18*c*. Those skilled in the art will recognize that care must be taken to ensure that the attachment methods used in subsequent steps in the assembly process are compatible with prior steps; for, example, the melting temperature of a solder used in a subsequent step should be lower than that used in a prior step in order to prevent undesired melting and re-flow of solder employed for attachment in the prior step.

Figure 19A:
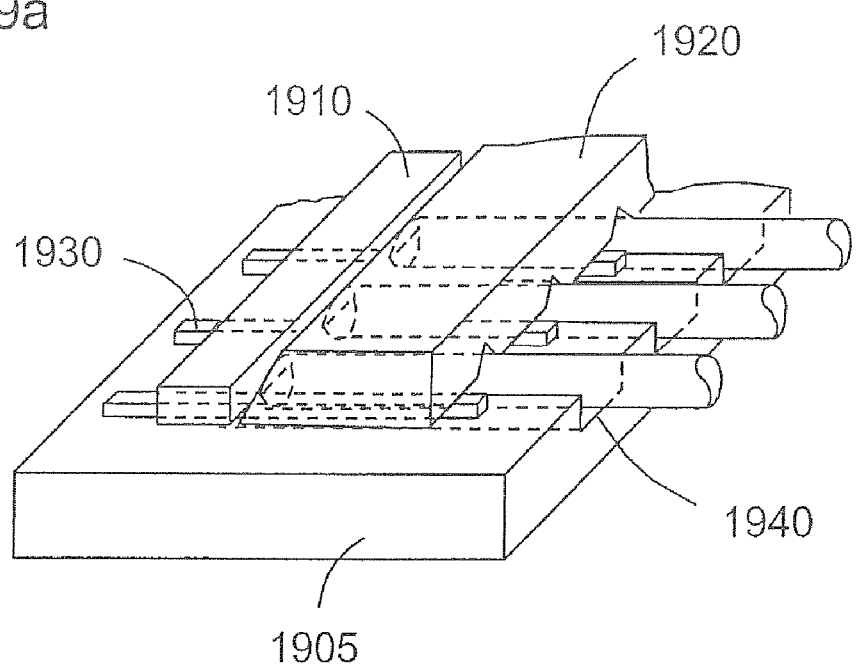
FIG. 19a is a symbolic diagram, shown in plan and elevated side views, of an alternative embodiment of the invention wherein a laser array is coupled directly to an optical fiber array.
Figure 19B:
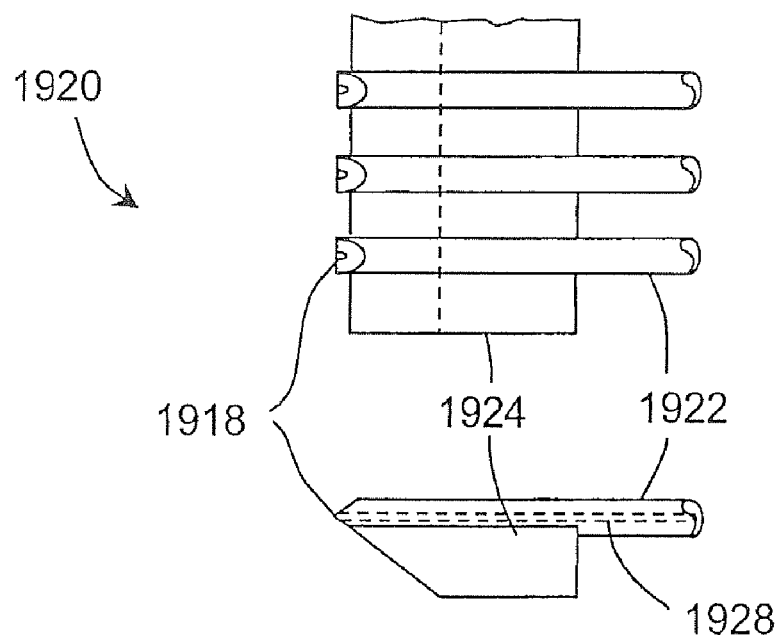

FIGS. 19*a* and 19*b* depict another embodiment of a pump source 1900 in accordance with the present invention, which utilizes a modification of the single sided silicon v-groove mounted fiber array depicted in FIGS. 18*a-c*. In contradistinction to the previous embodiment, wherein the optical fibers are polished normal to their longitudinal axes (or at a shallow angle thereto in order to suppress back reflections), optical fibers 1922 may be polished at a relatively sharp angle from two opposing sides to form chisel shaped fiber ends 1918, with the chisel shape preferably substantially centered on and symmetric about the center of a core 1928 of optical fiber 1922 as shown in plan and side views in FIG. 19*a*. Again, the polishing process may be facilitated by the addition of a temporarily attached second silicon v-groove piece, which is subsequently removed after polishing. The lithographically defined width of the v-grooves is preferably chosen such that the centers of the cores 1928 of optical fibers 1922 are accurately located at the same vertical distance from the surface of the v-groove silicon wafer as the laser array emitters are located beneath the major surface of the diode laser wafer. The separation of the v-grooves is chosen to match the lateral spacing of the emitters in laser array 1910.

Laser array 1910 is coupled directly to an array 1920 of chisel or lens ended fibers 1922 assembled in the single-sided v-groove holder 1924, omitting the IO waveguide chip shown in the above embodiments while still providing simultaneous coupling of all the emitters in laser array 1910 using a standoff structure 1930 defining a reference surface to ensure accurate, passive, alignment in the critical vertical dimension. Submount 1905 may also be adapted with relief slots 1940 as described above in connection with FIGS. 18a and 18c. In the presently described embodiment it is preferable that laser array 1910 is mounted using the techniques described above, and accurately positioned such that the emitters are substantially centered with respect to relief slots 1940. In the longitudinal dimension, laser array 1910 is preferably located in close proximity to the proximal end of the corresponding relief slot 1940 such that the slot does not substantially undercut the area of array 1910 that would otherwise compromise the electrical, mechanical and thermal properties of the bond between laser array 1910 and submount 1905.

Optical alignment in this embodiment is preferably performed by mounting v-groove fiber array 1920 on a computer controlled micropositioner with fibers 1922 facing relief slots 1940 in submount 1905. V-groove fiber array 1920 is brought substantially into uniform contact with the reference surface using the techniques described above. The lateral and longitudinal positions of fiber array 1920 are then optimized to maximize the power coupled from the energized laser emitters to optical fibers 1922. After final alignment, mechanical attachment of fiber array 1922 to submount 1905 may be achieved using solder, thermally or UV cured epoxy, or other suitable adhesive to yield pump source 1900, as shown in FIG. 19b.

FIG. 21 is a block diagram depicting yet another embodiment of the present invention, which provides for pumping of multiple EDFAs from a single laser array pump source of this invention. This can provide advantages such as significant simplification in construction of optical fiber systems where multiple EDFAs are required at a given physical location, and compact design for signal amplification without WDM, where desired.

A laser array pump source 2310 is optically connected by its output fibers 2320 to EDFAs 2390. While connection by three output fibers to three EDFAs is illustrated for purposes of clarity in the figure, it is apparent that such connection may be made to a greater or lesser number of EDFAs as desired for different applications, for example to 8 EDFAs, by 8 output fibers, as limited by the number of outputs of pump source 2310. Each EDFA 2390 is shown to have a signal input fiber 2330, an amplified signal output fiber 2340, a forward pumping port 2370 and a backward pumping port 2380. Pump output fibers 2320 are shown to be connected to the forward pumping ports 2370, but alternatively, the connection may be made to backward pumping ports 2380 (as indicated by dashed lines), instead. Various EDFAs are known in the art and are available from commercial suppliers, such as the PureGain™2500C optical amplifier available from Corning Incorporated (Corning, N.Y.).

Other alternate, known pump connection schemes may be employed. For example, simultaneous forward and backward pumping may be implemented according to this embodiment by connecting two different output fibers of the laser array pump source to each EDFA, one to the forward and one to the backward pumping port. A laser array pump source of this invention can provide such pumping to a number of EDFAs that is one half the number of its outputs.

As used herein, a given event is "responsive" to a predecessor event if the predecessor event influenced the given event. If there is an intervening processing element, step or time period, the given event can still be "responsive" to the predecessor event. If the intervening processing element or step combines more than one event, the signal output of the processing element or step is considered "responsive" to each of the event inputs. If the given event is the same as the predecessor event, this is merely a degenerate case in which the given event is still considered to be "responsive" to the predecessor event. "Dependency" of a given event upon another event is defined similarly.

It will be recognized by those skilled in the art that, while the invention has been described above in terms of preferred embodiments, it is not limited thereto. For example, any and all variations described, suggested or incorporated by reference in the Background section of this patent application are specifically incorporated by reference into the description herein of embodiments of the invention. In addition, various features and aspects of the above described invention may be used individually or jointly. Further, although the invention has been described in the context of its implementation in a particular environment and for particular applications, e.g., telecommunications, those skilled in the art will recognize that its usefulness is not limited thereto and that the present invention can be beneficially utilized in any number of environments and implementations. Accordingly, the claims set forth below should be construed in view of the full breadth and spirit of the invention as disclosed herein.

The invention claimed is:

1. Optical apparatus comprising:
   a first submount having a standoff structure protruding from a first surface thereof;
   an optical emitter chip bonded to said first submount, said optical emitter chip including a plurality of optical emitters arranged along a first edge of said emitter chip, said plurality of optical emitters including a first optical emitter, said optical emitter chip contacting said standoff structure in a first plurality of contact portions of said standoff structure, said first plurality of contact portions including all points on said standoff structure which contact said emitter chip, at least three consecutive ones of said contact portions along a straight line being mutually isolated from each other along said straight line; and
   an integrated optics chip having a first optical receiver, said integrated optics chip being bonded to said first submount in such a way that said first optical receiver can receive optical energy emitted by said first emitter,
   wherein said straight line is parallel to said first edge of said optical emitter chip so as to minimize bowing of said optical emitter chip along the edge along which the plurality of optical emitters are arranged.

2. Apparatus according to claim 1, wherein said integrated optics chip contacts said standoff structure in a second plurality of contact portions of said standoff structure, said second plurality of contact portions including all points on said standoff structure which contact said integrated optics chip, at least three consecutive ones of said contact portions in said second plurality of contact portions along a given straight line being mutually isolated from each other along said given straight line.

3. Apparatus according to claim 1, further comprising an epoxy bonding said emitter chip to said first submount, said epoxy being located between two of said contact portions on said first submount and not on any of said contact portions.

4. Apparatus according to claim 1, further comprising solder bonding said emitter chip to said first submount, said solder being located between two of said contact portions on said first submount and not on any of said contact portions.

5. Apparatus according to claim 1, further comprising:
an electrical trace disposed on said first submount between said contact portions;
and an electrical connection pad on said emitter chip; and
an electrically conductive material bonding said emitter chip to said first submount and making electrical contact with both said electrical trace on said first submount and said electrical connection pad on said emitter chip.

6. Apparatus according to claim 1, further comprising:
an electrical trace disposed on said first submount between said contact portions;
and an electrical connection pad on said integrated optics chip; and
an electrically conductive material bonding said integrated optics chip to said first submount and making electrical contact with both said electrical trace on said first submount and said electrical connection pad on said integrated optics chip.

7. Apparatus according to claim 6, wherein said electrically conductive material is a solder.

8. Apparatus according to claim 1, wherein said standoff structure comprises a plurality of ribs arranged such that each rib includes a respective first segment which is in said first plurality of contact portions and a respective second segment which extends under said integrated optics chip.

9. Apparatus according to claim 1, wherein said integrated optics chip includes a first optical output,
further comprising a first optical fiber having a receiving end disposed such that it can receive optical energy output from said first optical output of said integrated optics chip.

10. Apparatus according to claim 9, further comprising an optical amplifier having an optical pump input connected to receive optical energy from said first optical fiber.

11. Apparatus according to claim 9, wherein said integrated optics chip comprises a mode converter in an optical path from said first optical receiver to said first optical output.

12. Apparatus according to claim 9, wherein said integrated optics chip comprises:
an input waveguide segment receiving optical energy from said first optical receiver and supporting an input optical mode;
an output waveguide segment downstream of said input waveguide segment and providing optical energy to said first optical output and supporting an output optical mode; and
a mode converter disposed in an optical path from said input optical waveguide segment to said output waveguide segment and converting said input optical mode to said output optical mode.

13. Apparatus according to claim 12, wherein said input optical mode optimizes acceptance of optical energy from said first emitter into said input waveguide segment.

14. Apparatus according to claim 12, wherein said output optical mode optimizes delivery of optical energy from said first output of said integrated optics chip into said first optical fiber.

15. Apparatus according to claim 12, wherein said input optical mode optimizes acceptance of optical energy from said first emitter into said input waveguide segment, and wherein said output optical mode matches an optical mode supported by said first optical fiber.

16. Apparatus according to claim 12, wherein said mode converter comprises a waveguide taper.

17. Apparatus according to claim 1, wherein said integrated optics chip comprises:
a first waveguide segment in a first optical path from said first optical receiver to a first optical output of said integrated optics chip;
a first feedback grating superimposed on said first waveguide segment; and
a first optical monitor disposed to receive optical energy scattered out of said waveguide by said feedback grating.

18. Apparatus according to claim 1, wherein said integrated optics chip comprises:
a first waveguide segment in a first optical path from said first optical receiver to a first optical output; and
a first wavelength stabilizer disposed in said first waveguide segment.

19. Apparatus according to claim 18, wherein said wavelength stabilizer comprises a first feedback grating superimposed on said first waveguide segment.

20. Apparatus according to claim 18, wherein said integrated optics chip further comprises a first waveguide taper in said first path upstream of said first waveguide segment.

21. Apparatus according to claim 18, wherein said integrated optics chip further comprises a second waveguide taper in said first path downstream of said first waveguide segment.

22. Apparatus according to claim 18, wherein said emitter chip further has a second optical emitter and said integrated optics chip has a second optical receiver, said integrated optics chip being disposed further so that said second optical receiver can receive optical energy emitted by said second emitter,
and wherein said integrated optics chip further comprises a second wavelength stabilizer in a second waveguide segment in a second optical path downstream of said second optical receiver.

23. Apparatus according to claim 22, wherein said first and second wavelength stabilizers are tuned to different wavelengths,
and wherein said integrated optics chip further comprises a directional coupler in said first path downstream of said first stabilizer and coupling optical energy from said second path downstream of said second stabilizer into said first path toward said first optical output.

24. Apparatus according to claim 22, wherein said first and second wavelength stabilizers are tuned to different wavelengths,
wherein said second optical path in said integrated optics chip terminates with a second optical output of said integrated optics chip,
further comprising a fused fiber coupler having first and second receiving optical fibers, said first receiving fiber being disposed such that it can receive optical energy output from said first optical output of said integrated optics chip, and said second receiving fiber being disposed such that it can receive optical energy output from said second optical output of said integrated optics chip.

25. Apparatus according to claim 1, wherein said emitter chip further has a second optical emitter and said integrated optics chip has a second optical receiver, said integrated optics chip being disposed further so that said second optical receiver can receive optical energy emitted by said second emitter, and wherein said integrated optics chip further comprises a directional coupler having a first input in a first optical path downstream of said first optical receiver, a second input in a second optical path downstream of said second optical receiver, and an output in an optical path upstream of said first optical output.

26. Apparatus according to claim 1, wherein said integrated optics chip comprises a polarization rotator disposed in a first optical path from said first optical receiver to a first optical output of said integrated optics chip.

27. Apparatus according to claim 26, wherein said emitter chip further has a second optical emitter and said integrated optics chip has a second optical receiver, said integrated optics chip being disposed further so that said second optical receiver can receive optical energy emitted by said second emitter, and wherein said integrated optics chip further comprises a directional coupler in said first path downstream of said polarization rotator and coupling optical energy into said first path toward said first optical output from said second optical receiver.

28. Apparatus according to claim 1, wherein said integrated optics chip comprises a power monitor disposed to monitor optical power received by said first optical receiver.

29. Apparatus according to claim 1, wherein said integrated optics chip comprises a controllable optical switch.

30. Apparatus according to claim 1, wherein said emitter chip further has a second and third optical emitters and said integrated optics chip has second and third optical receivers, said integrated optics chip being disposed further such that said second optical receiver of said integrated optics chip can receive optical energy emitted by said second emitter and such that said third optical receiver of said integrated optics chip can receive optical energy emitted by said third emitter, and wherein said integrated optics chip further comprises:
a first waveguide in a first path from said first optical receiver to a first optical output of said integrated optical chip;
a second waveguide in a second path from said second optical receiver to a second optical output of said integrated optical chip; and
a cross-connect switching structure which switches optical energy from said third optical receiver selectably into (a) said first path toward said first optical output, (b) or said second path toward said second optical output, or (c) neither.

31. Apparatus according to claim 1, wherein said integrated optics chip has a plurality of optical outputs, further comprising an optical fiber array having a plurality of optical fibers, each of said fibers having a respective receiving end disposed to receive optical energy output from a respective one of the optical outputs of said integrated optics chip.

32. Apparatus according to claim 31, wherein said optical fiber array is attached to said first submount.

33. Apparatus according to claim 32, wherein each of said optical fibers is affixed in a respective longitudinally-oriented v-groove in said first submount downstream of said integrated optics chip.

34. Apparatus according to claim 32, wherein said first submount includes longitudinally-oriented recesses, further comprising:
a fiber holder having a plurality of longitudinally-oriented v-groove in the undersurface thereof, each of said fibers being affixed in a respective one of said v-grooves, and said fiber holder being attached to said first submount with the undersurface of said fiber holder facing said first surface of said first submount, said fibers depending below the undersurface of said fiber holder and into said recesses in said first submount.

35. Apparatus according to claim 31, wherein said integrated optics chip has an overhang portion overhanging said first submount, further comprising:
a second submount having a second standoff structure protruding from a first surface thereof, said overhang portion of said integrated optics chip being attached to said second standoff structure such that said integrated optics chip contacts said second standoff structure in a third plurality of contact portions of said second standoff structure,
said optical fiber array being attached to said second submount.

36. Apparatus according to claim 35, wherein said second submount is spaced longitudinally from said first submount.

37. Apparatus according to claim 35, wherein said second submount includes longitudinally-oriented recesses, further comprising:
a fiber holder having a plurality of longitudinally-oriented v-groove in the undersurface thereof, each of said fibers being affixed in a respective one of said v-grooves, and said fiber holder being attached to said second submount with the undersurface of said fiber holder facing said first surface of said second submount, said fibers depending below the undersurface of said fiber holder and into said recesses in said second submount.

38. Apparatus according to claim 31, further comprising an optical amplifier having an optical pump input connected to receive optical energy from one of said optical fibers.

39. Apparatus according to claim 31, further comprising a plurality of optical amplifiers each having an optical pump input connected to receive optical energy from a respective one of said optical fibers.

40. Apparatus according to claim 1, wherein said integrated optics chip has first and second optical outputs, both having a common plane of optical polarization, further comprising:
a polarization coupler having first and second polarization maintaining input fibers and an output fiber, said first input fiber being attached so as to receive optical energy from said first optical output, said first input fiber being attached with a first rotation relative to said output fiber, and said second input fiber being attached so as to receive optical energy from said second optical output, said second input fiber being attached with a second rotation 90° different from said first input fiber.

41. Optical apparatus comprising:
a submount having a standoff structure protruding from a first surface thereof;
an integrated optics chip bonded to said submount, said integrated optics chip including a plurality of optical receivers arranged along a first edge of said integrated optics chip, said plurality of optical receivers including a first optical receiver, said integrated optics chip contacting said standoff structure in a first plurality of contact portions of said standoff structure, said first plurality of contact portions including all points on said standoff structure which contact said integrated optics chip, at least three consecutive ones of said contact portions along a straight line being mutually isolated from each other along said straight line; and an optical emitter chip having a first optical emitter, said optical emitter chip being bonded to said submount in such a way that said first optical receiver can receive optical energy emitted by said first emitter, wherein said straight line is parallel to said first edge of said integrated optics chip so as to minimize bowing of said integrated optics chip along the edge along which the plurality of optical receivers are arranged.

42. Optical apparatus comprising:

a first submount having a standoff structure protruding from a first surface thereof;

an optical array emitter chip bonded to said first submount, said optical emitter chip having a plurality of optical emitters arranged along a first edge of said emitter chip, said optical emitter chip contacting said standoff structure in a first plurality of contact portions of said standoff structure, said first plurality of contact portions including all points on said standoff structure which contact said emitter chip, at least three consecutive ones of said contact portions along a straight line being mutually isolated from each other along said straight line; and an optical fiber array having a plurality of optical fibers, said optical fiber array being bonded to said first submount in such a way that said a receiving end of each of said fibers can receive optical energy emitted by a respective one of said optical emitters, wherein said straight line is parallel to said first edge of said optical emitter chip so as to minimize bowing of said optical emitter chip along the edge along which the plurality of optical emitters are arranged.

43. Apparatus according to claim 42, wherein said optical fiber array contacts said standoff structure in a second plurality of contact portions of said standoff structure, said second plurality of contact portions including all points on said standoff structure which contact said optical fiber array, at least three consecutive ones of said contact portions in said second plurality of contact portions along a given straight line being mutually isolated from each other along said given straight line.

44. Apparatus according to claim 42, further comprising:

an electrical trace disposed on said first submount between said contact portions;

and an electrical connection pad on said emitter chip; and an electrically conductive material bonding said emitter chip to said first submount and making electrical contact with both said electrical trace on said first submount and said electrical connection pad on said emitter chip.

45. Apparatus according to claim 42, wherein said standoff structure comprises a plurality of ribs arranged such that each rib includes a respective first segment which is in said first plurality of contact portions and a respective sound segment which extends under said optical fiber array.

46. Apparatus according to claim 42, wherein said first submount includes longitudinally-oriented recesses, wherein said optical fiber array comprises a fiber holder having a plurality of longitudinally-oriented v-groove in the undersurface thereof, each of said fibers being affixed in a respective one of said v-grooves, and and wherein said fiber holder is attached to said first submount with the undersurface of said fiber holder facing said first surface of said first submount, said fibers depending below the undersurface of said fiber holder and into said recesses in said first submount.

47. Apparatus according to claim 42, further comprising an optical amplifier having an optical pump input connected to receive optical energy from one of said optical fibers.

48. Apparatus according to claim 42, further comprising a plurality of optical amplifiers each having an optical pump input connected to receive optical energy from a respective one of said optical fibers.

49. Optical apparatus comprising:

a first submount having a standoff structure protruding from a first surface thereof;

an integrated optics chip bonded to said submount, said integrated optics chip having a plurality of optical receivers arranged along a first edge of said integrated optics chip, said integrated optics chip contacting said standoff structure in a first plurality of contact portions of said standoff structure, said first plurality of contact portions including all points on said standoff structure which contact said integrated optics chip, at least three consecutive ones of said contact portions along a straight line being mutually isolated from each other along said straight line; and an optical fiber array having a plurality of optical fibers, said optical fiber array being bonded to said submount in such a was that each of said optical receivers can receive optical energy emitted by an emitting end of a respective one of said fibers, wherein said straight lines is parallel to said first edge of said integrated optics chip so as to minimize bowing of said integrated optics chip along the edge along which the plurality of optical receivers are arranged.

* * * * *

UNITED STATES PATENT AND TRADEMARK OFFICE
CERTIFICATE OF CORRECTION

| | |
|---|---|
| PATENT NO. | : 7,653,109 B2 |
| APPLICATION NO. | : 11/768150 |
| DATED | : January 26, 2010 |
| INVENTOR(S) | : William K. Bischel et al. |

It is certified that error appears in the above-identified patent and that said Letters Patent is hereby corrected as shown below:

At column 40, claim 45, line 6, replace "sound" with --second--; at column 40, claim 46, line 14, delete "and"; at column 40, claim 49, line 42, replace "was" with --way--; at column 40, claim 49, line 45, replace "lines" with --line--.

Signed and Sealed this

Twenty-third Day of March, 2010

David J. Kappos
*Director of the United States Patent and Trademark Office*